(12) United States Patent
Nishida et al.

(10) Patent No.: US 7,893,505 B2
(45) Date of Patent: Feb. 22, 2011

(54) SEMICONDUCTOR INTEGRATED CIRCUIT DEVICE

(75) Inventors: Akio Nishida, Tachikawa (JP); Yasuko Yoshida, Sayama (JP); Shuji Ikeda, Koganei (JP)

(73) Assignee: Renesas Electronics Corporation, Kanagawa (JP)

( * ) Notice: Subject to any disclaimer, the term of this patent is extended or adjusted under 35 U.S.C. 154(b) by 14 days.

(21) Appl. No.: 12/362,995

(22) Filed: Jan. 30, 2009

(65) Prior Publication Data
US 2009/0218608 A1    Sep. 3, 2009

Related U.S. Application Data

(60) Division of application No. 11/342,695, filed on Jan. 31, 2006, now Pat. No. 7,488,639, which is a continuation of application No. 10/363,055, filed as application No. PCT/JP01/11426 on Dec. 26, 2001, now Pat. No. 7,067,864.

(30) Foreign Application Priority Data

Jan. 30, 2001    (JP) .............................. 2001-022132

(51) Int. Cl.
*H01L 21/8234* (2006.01)
*H01L 21/8244* (2006.01)

(52) U.S. Cl. .................. 257/401; 257/206; 257/296; 257/368; 257/379; 257/E27.098; 257/E21.661; 438/210

(58) Field of Classification Search ......... 257/213–413, 257/900, 902–903, E21.19–E21.21, E21.394–E21.458, 257/E21.615–E21.694, E27.098–E27.101, 257/E27.077, E21.661, 206, 296, 327, 350, 257/368, 379, 390, 393, 401; 438/197–210
See application file for complete search history.

(56) References Cited

U.S. PATENT DOCUMENTS 4,882,289 A  * 11/1989  Moriuchi et al. ............ 438/241
5,100,817 A     3/1992  Cederbaum et al.
(Continued)

FOREIGN PATENT DOCUMENTS

JP    02-040951    2/1990

(Continued)

*Primary Examiner*—Matthew C Landau
*Assistant Examiner*—Maliheh Malek
(74) *Attorney, Agent, or Firm*—Antonelli, Terry, Stout & Kraus, LLP.

(57) ABSTRACT

In order to provide a semiconductor integrated circuit device such as a high-performance semiconductor integrated circuit device capable of reducing a soft error developed in each memory cell of a SRAM, the surface of a wiring of a cross-connecting portion, of a SRAM memory cell having a pair of n-channel type MISFETs whose gate electrodes and drains are respectively cross-connected, is formed in a shape that protrudes from the surface of a silicon oxide film. A silicon nitride film used as a capacitive insulating film, and an upper electrode are formed on the wiring. A capacitance can be formed of the wiring, the silicon nitride film and the upper electrode.

6 Claims, 40 Drawing Sheets

U.S. PATENT DOCUMENTS

| | | | |
|---|---|---|---|
| 5,128,274 A * | 7/1992 | Yabu et al. | 438/452 |
| 5,404,326 A | 4/1995 | Okamoto | |
| 5,514,615 A | 5/1996 | Ema et al. | |
| 5,521,859 A | 5/1996 | Ema et al. | |
| 5,523,598 A | 6/1996 | Watanabe et al. | |
| 5,536,674 A | 7/1996 | Kosa et al. | |
| 5,677,249 A * | 10/1997 | Fukui et al. | 438/128 |
| 5,714,778 A | 2/1998 | Yamazaki | |
| 5,780,328 A * | 7/1998 | Fukuda et al. | 438/201 |
| 5,946,565 A * | 8/1999 | Ikeda et al. | 438/238 |
| 6,069,038 A * | 5/2000 | Hashimoto et al. | 438/241 |
| 6,121,086 A * | 9/2000 | Kuroda et al. | 438/256 |
| 6,171,892 B1 * | 1/2001 | Kikushima et al. | 438/199 |
| 6,235,572 B1 * | 5/2001 | Kunitomo et al. | 438/240 |
| 6,245,611 B1 * | 6/2001 | Hashimoto et al. | 438/238 |
| 6,271,569 B1 * | 8/2001 | Ishigaki et al. | 257/381 |
| 6,307,217 B1 | 10/2001 | Ikeda et al. | |
| 6,342,412 B1 * | 1/2002 | Sugiura et al. | 438/197 |
| 6,424,011 B1 | 7/2002 | Assadeeraghi et al. | |
| 6,603,178 B2 * | 8/2003 | Kikushima et al. | 257/369 |
| 6,734,060 B2 * | 5/2004 | Nakamura et al. | 438/253 |
| 6,900,513 B2 * | 5/2005 | Natsume | 257/508 |
| 7,067,864 B2 * | 6/2006 | Nishida et al. | 257/296 |
| 2001/0001718 A1 * | 5/2001 | Kikushima et al. | 438/238 |
| 2001/0023965 A1 * | 9/2001 | Ikeda et al. | 257/368 |
| 2002/0019100 A1 * | 2/2002 | Shukuri et al. | 438/275 |
| 2003/0189255 A1 * | 10/2003 | Sugiura et al. | 257/774 |
| 2003/0205766 A1 * | 11/2003 | Kikushima et al. | 257/369 |
| 2004/0067614 A1 * | 4/2004 | Hidaka et al. | 438/200 |
| 2004/0203199 A1 * | 10/2004 | Kikushima et al. | 438/200 |
| 2005/0042827 A1 * | 2/2005 | Hashimoto et al. | 438/258 |
| 2005/0242405 A1 * | 11/2005 | Hashimoto et al. | 257/393 |
| 2008/0061381 A1 * | 3/2008 | Hashimoto et al. | 257/393 |

FOREIGN PATENT DOCUMENTS

| | | |
|---|---|---|
| JP | 4-291958 A | 10/1992 |
| JP | 6-13575 A | 1/1994 |
| JP | 06-21394 | 1/1994 |
| JP | 06-216344 | 8/1994 |
| JP | 6-216435 | 8/1994 |
| JP | 07-099255 | 4/1995 |
| JP | 08-139206 | 5/1996 |
| JP | 9-17965 A | 1/1997 |
| JP | 10-163440 A | 6/1998 |
| JP | 9-17962 | 1/1999 |
| JP | 11-17027 A | 1/1999 |
| JP | 11-026604 | 1/1999 |
| JP | 11-40680 | 2/1999 |
| JP | 2001-022132 | 1/2001 |
| JP | 2002-289703 A | 10/2002 |
| JP | 2003-007978 | 1/2003 |

* cited by examiner

SEMICONDUCTOR INTEGRATED CIRCUIT DEVICE

CROSS-REFERENCE TO RELATED APPLICATIONS

This application is a divisional application of U.S. application Ser. No. 11/342,695, filed Jan. 31, 2006 now U.S. Pat. No. 7,488,639, which, in turn, is a continuation application of U.S. application Ser. No. 10/363,055, filed Jun. 30, 2003 (now U.S. Pat. No. 7,067,864), which is the National Stage of International Application No. PCT/JP01/11426, filed Dec. 26, 2001; and the entire disclosures of which are incorporated herein by reference.

BACKGROUND OF THE INVENTION

The present invention relates to a semiconductor integrated circuit device and a technology for manufacturing the same, and particularly to a technology effective for application to a semiconductor integrated circuit device having a SRAM (Static Random Access Memory).

A SRAM has been used as a cache memory used for a personal computer and a work station.

The SRAM comprises a flip-flop circuit for storing one-bit information therein and two information transfer MISFETs (Metal Insulator Semiconductor Field Effect Transistors). The flip-flop circuit comprises, for example, a pair of driver MISFETs and a pair of load MISFETs.

A problem associated with a soft error produced due to an α ray arises in each memory cell of such a memory. The soft error produced due to the α ray is a phenomenon in which an α ray contained in external cosmic radiation, or an α ray emitted from a radioactive atom contained in a package material for an LSI enters a memory cell and damages or corrupts information stored in the memory cell.

In order to take measures against such an α ray, a method has been discussed which adds capacitance to an information storage unit (corresponding to an input/output part of the flip-flop circuit) in the memory cell to thereby increase the capacitance of the information storage unit.

A technology for forming a capacitor or capacitance by polycrystalline silicon 10 connected to drain regions of FETs Qp' and Qnd', and polycrystalline silicon 11 connected to drain regions of FETs Qp and Qnd to thereby improve resistance to a soft error has been described in Unexamined Patent Publication No. Hei 11(1999)-17027, for example.

Further, there is disclosed in Unexamined Patent Publication No. Hei 10(1998)-163440 a technology for constituting a capacitor C by local wirings L1 and L2 at which input/output terminals of a flip-flop circuit for storing information therein are cross-connected, and a thin insulating film interposed between the two thereby to increase the capacity of a storage node of each memory cell, thus preventing a reduction in resistance to an α ray-based soft error.

SUMMARY OF THE INVENTION

However, with advances in memory cell scale-down incident to high integration of each memory cell, an area where the capacitance can be formed, also decreases. Thus there is a limit to increase the capacity of the information unit.

On the other hand, targeted values for capacitance also increase according to intended purposes of products. FIG. 48 is a diagram showing the relationship between incident energy (MeV) of α rays to a product having a power supply voltage (Vcc) of 1.2V and a product having a power supply voltage (Vcc) of 1.5V, and the amount of noise charges (C). As shown in FIG. 48, an electrical charge (noise) is stored in an information storage unit when the α ray is applied to the information storage unit. The maximum value of the charge results in 6.2 fC in the case of the 1.2V product. Since the critical amount of charge for this product is given as 4.3 fF, it is necessary to add a capacitor or capacitance capable of storing a charge amount of 1.9 (=6.2-4.3) fC or more to each node. Since the maximum value of the charge is 6.1 fF and the critical amount of charge is 3.4 fC in the case of the 1.5V product, it is necessary to add a capacitor or capacitance capable of storing a charge amount of 2.7 (=6.1-3.4) fC to each node. Incidentally, the critical amount of charge indicates the amount of an electrical charge which inverts information (1 or 0) held in the information storage unit.

The required capacitance is becoming great despite of the reduction in the capacitance-formable area with the scale down of each memory cell.

An object of the present invention is to provide a semiconductor integrated circuit device, e.g., a technology for ensuring the capacitance of an information storage unit of each memory cell in a SRAM to thereby make it possible to reduce a soft error produced due to an α ray.

Another object of the present invention is to provide a semiconductor integrated circuit device, e.g., a semiconductor integrated circuit device that reduces a soft error produced in each memory cell of a SRAM.

The above objects and novel features of the present invention will become apparent from the description of the present specification and the accompanying drawings.

Summaries of typical ones of the inventions disclosed in the present application will be described in brief as follows:

(1) A semiconductor integrated circuit device of the present invention, which has memory cells each including, as components, a pair of n-channel type MISFETs whose gate electrodes and drains are respectively cross-connected, comprises an interlayer insulating film formed on the n-channel type MISFETs; a conductive layer which connects the gate electrodes and the drains, the conductive layer being formed within a connecting hole extending from the gate electrode to the drain, and having a protruding portion which protrudes from the surface of the interlayer insulating film; a capacitive insulating film formed along an upper portion of the conductive layer and sidewalls of the protruding portion; and an upper electrode formed on the capacitive insulating film. According to such means, since a capacitor or capacitance can be formed of the conductive layer, capacitive insulating film and upper electrode, a soft error produced due to an α ray can be lessened. Since a capacitance can be formed even at each of the sidewalls of the protruding portion of the conductive layer, an increase in capacity can be achieved.

(2) A semiconductor integrated circuit device of the present invention, which has memory cells each including, as components, a pair of n-channel type MISFETs whose gate electrodes and drains are respectively cross-connected, comprises an interlayer insulating film formed on the n-channel type MISFETs; a conductive layer which connects the gate electrode and the drain and is formed within a connecting hole extending from the gate electrode to the drain; an lower electrode formed over the conductive layer; a capacitive insulating film formed over the lower electrode; and an upper electrode formed on the capacitive insulating film. According to such means, since a capacitor or capacitance can be formed of the lower electrode, capacitive insulating film and upper electrode, a soft error produced due to an α ray can be reduced. If an area for forming the lower electrode is set larger than an area for forming the conductive layer, then an increase in capacity can be achieved.

(3) A semiconductor integrated circuit device of the present invention, which has memory cells each including, as components, a pair of n-channel type MISFETs whose gate electrodes and drains are respectively cross-connected, comprises an interlayer insulating film formed on the n-channel type MISFETs; a conductive layer which connects the gate electrode and the drain, the conductive layer being formed within a connecting hole extending from the gate electrode to the drain, and having a protruding portion which protrudes from the surface of the interlayer insulating film; a lower electrode formed along an upper portion of the conductive layer and sidewalls of the protruding portion; a capacitive insulating film formed over the lower electrode; and an upper electrode formed on the capacitive insulating film. According to such means, since a capacitor or capacitance connected to the conductive layer can be formed of the lower electrode, capacitive insulating film and upper electrode, a soft error produced due to an α ray can be reduced. If an area for forming the lower electrode is set larger than an area for forming the conductive layer, then the capacitance can be increased. Further, since a capacitance can be formed even on the lower electrode formed along the sidewalls of the protruding portion of the conductive layer, an increase in capacity can be achieved.

(4) A semiconductor integrated circuit device of the present invention, which has memory cells each including, as components, a pair of n-channel type MISFETs whose gate electrodes and drains are respectively cross-connected, comprises an interlayer insulating film formed on the n-channel type MISFETs; a conductive layer which connects the gate electrode and the drain, the conductive layer being formed within a connecting hole extending from the gate electrode to the drain, and having a concave portion formed in the surface thereof; a capacitive insulating film formed over the conductive layer including the interior of the concave portion; and an upper electrode formed on the capacitive insulating film. According to such means, since a capacitor can be formed of the conductive layer, capacitive insulating film and upper electrode, a soft error produced due to an α ray can be lessened. Since a capacitance can be formed even on the concave portion of the conductive layer, an increase in capacity can be achieved.

(5) A method of manufacturing a semiconductor integrated circuit device, according to the present invention, which has memory cells each including, as components, a pair of n-channel type MISFETs whose gate electrodes and drains are respectively cross-connected, comprises the steps of forming the n-channel type MISFETs; forming an interlayer insulating film on the n-channel type MISFETs; forming a connecting hole extending from over the gate electrode of each of the n-channel type MISFETs to the drain thereof; depositing a conductive film on the interlayer insulating film including the interior of the connecting hole; polishing the conductive film until the surface of the interlayer insulating film is exposed, thereby to form a conductive layer embedded in the connecting hole; further etching the exposed surface of the interlayer insulating film to thereby expose upper portions of sidewalls of the conductive layer; forming a capacitive insulating film along the upper portions of the conductive layer and the exposed sidewalls; and forming an upper electrode on the capacitive insulating film. According to such means, a semiconductor integrated circuit device can be formed which reduces a soft error owing to a capacitance formed of the conductive layer, capacitive insulating film and upper electrode. The surface of the interlayer insulating film is further etched to expose the upper portions of the sidewalls of the conductive layer, thereby making it possible to achieve an increase in capacity.

(6) A method of manufacturing a semiconductor integrated circuit device, according to the present invention, which has memory cells each including, as components, a pair of n-channel type MISFETs whose gate electrodes and drains are respectively cross-connected, comprises the steps of forming the n-channel type MISFETs; forming an interlayer insulating film on the n-channel type MISFETs; forming a connecting hole extending from over a gate electrode of one of the pair of n-channel type MISFETs to a drain of the other thereof; depositing a conductive film on the interlayer insulating film including the interior of the connecting hole; forming a lower electrode over the conductive layer; forming a capacitive insulating film on the lower electrode; and forming an upper electrode on the capacitive insulating film. According to such means, a semiconductor integrated circuit device can be formed which reduces a soft error owing to a capacitance formed of the lower electrodes, capacitive insulating film and upper electrode. If an area for forming the lower electrode is set larger than an area for forming the conductive layer, then an increase in capacity can be achieved.

(7) A method of manufacturing a semiconductor integrated circuit device, according to the present invention, which has memory cells each including, as components, a pair of n-channel type MISFETs whose gate electrodes and drains are respectively cross-connected, comprises the steps of forming the n-channel type MISFETs; forming an interlayer insulating film on the n-channel type MISFETs; forming a connecting hole extending from over a gate electrode of one of the pair of n-channel type MISFETs to a drain of the other thereof; depositing a conductive film on the interlayer insulating film including the interior of the connecting hole; grinding the conductive film until the surface of the interlayer insulating film is exposed, thereby to form a conductive layer embedded in the connecting hole; further etching the exposed surface of the interlayer insulating film to thereby expose upper portions of sidewalls of the conductive layer; forming a lower electrode along the upper portion and exposed sidewalls of the conductive layer; forming a capacitive insulating film on the lower electrode; and forming an upper electrode on the capacitive insulating film. According to such means, a semiconductor integrated circuit device can be formed which reduces a soft error owing to a capacitor or capacitance formed of the lower electrode, capacitive insulating film and upper electrode. If an area for forming the lower electrode is made larger than an area for forming the conductive layer, then an increase in capacity can be achieved. Since a capacitance can be formed even on the lower electrode formed along the exposed sidewalls of the conductive layer, an increase in capacity can be achieved.

(8) A method of manufacturing a semiconductor integrated circuit device, according to the present invention, which has memory cells each including, as components, a pair of n-channel type MISFETs whose gate electrodes and drains are respectively cross-connected, comprises the steps of forming the n-channel type MISFETs; forming an interlayer insulating film on the n-channel type MISFETs; forming a connecting hole extending from over a gate electrode of each of the n-channel type MISFETs to a drain thereof; depositing a conductive film on the interlayer insulating film including the interior of the connecting hole, the conductive film having a thickness smaller than the radius of the connecting hole; polishing the conductive film until the surface of the interlayer insulating film is exposed, thereby to form a conductive layer embedded in the connecting hole and having a concave portion formed in an upper portion thereof; forming a capacitive insulating film over the conductive layer; and forming an upper electrode on the capacitive insulating film. According to such means, a semiconductor integrated circuit device can be formed which reduces a soft error owing to a capacitor or capacitance formed of the conductive layer, capacitive insulating film and upper electrode. Since a capacitance can be formed even on the concave portion of the conductive layer, an increase in capacity can be achieved.

DETAILED DESCRIPTION OF THE PREFERRED EMBODIMENTS

Figure 1:
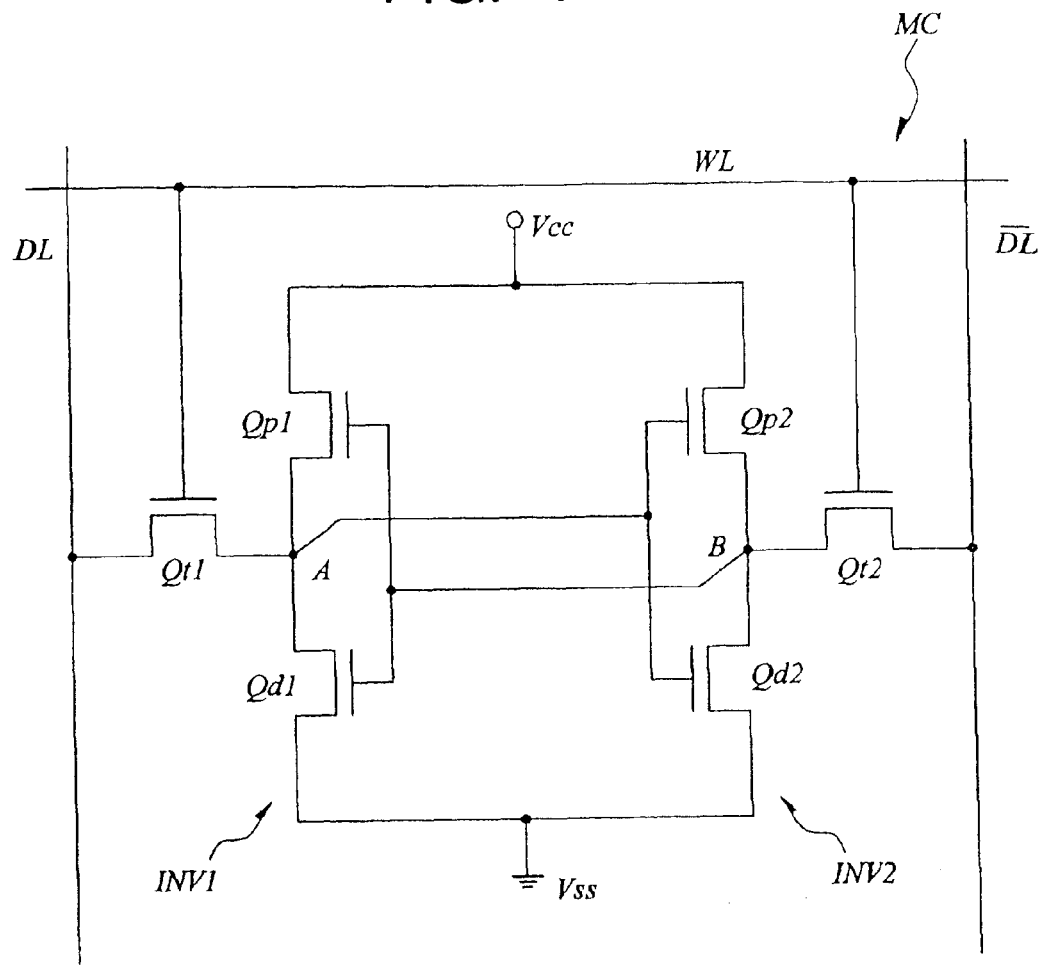
FIG. 1 is an equivalent circuit diagram showing a memory cell of a SRAM illustrative of a first embodiment of the present invention.

Preferred embodiments of the present invention will hereinafter be described in detail with reference to the accompanying drawings. Incidentally, structural components each having the same function in all the drawings for describing the embodiments are respectively identified by the same reference numerals and their repetitive description will therefore be omitted.

First Embodiments

FIG. 1 is an equivalent circuit diagram showing a memory cell of a SRAM illustrative of the first embodiment. As shown in the drawing, the memory cell MC is placed in a portion where a pair of complementary data lines (a data line DL and a data line /(bar) DL) and a word line WL intersect, and comprises a pair of driver MISFETs Qd1 and Qd2, a pair of load MISFETs Qp1 and Qp2, and a pair of transfer MISFETs Qt1 an Qt2. The driver MISFETs Qd1 and Qd2 and the transfer MISFETs Qt1 and Qt2 respectively comprise n-channel type MISFETs, whereas the load MISFETs Qp1 and Qp2 comprise p-channel type MISFETs respectively.

Of the six MISFETs constituting the memory cell MC, the driver MISFET Qd1 and the load MISFET Qp1 constitute a CMOS inverter INV1, and the driver MISFET Qd2 and the load MISFET Qp2 constitute a CMOS inverter INV2. Mutual input/output terminals (storage nodes A and B) of these pairs of CMOS inverters INV1 and INV2 are coupled to each other so as to intersect and constitute a flip-flop circuit used as an information storage unit for storing one-bit information therein. One input/output terminal (storage node A) of the flip-flop circuit is connected to one of source and drain regions of the transfer MISFET Qt1, whereas the other input/output terminal (storage node B) thereof is connected to one of source and drain regions of the transfer MISFET Qt2.

Further, the other of the source and drain regions of the transfer MISFET Qt1 is connected to the data line DL, and the other of the source and drain regions of the transfer MISFET Qt2 is connected to the data line /DL. One ends (source regions of load MISFETs Qp1 and Qp2) of the flip-flop circuit are connected to a power supply voltage (Vcc), whereas the other ends (source regions of driver MISFETs Qd1 and Qd2) are connected to a reference voltage (Vss).

The operation of the above circuit will be explained. When the storage node A of one CMOS inverter INV1 is of a high potential ("H"), the driver MISFET Qd2 is turned ON, so that the storage node B of the other CMOS inverter INV2 is brought to a low potential ("L"). Thus the driver MISFET Qd1 is turned OFF so that the high potential ("H") of the storage node A is held. Namely, the states of the mutual storage nodes A and B are held by the latch circuit wherein the pair of CMOS inverters INV1 and INV2 are cross-connected to each other, and hence information is stored while the power supply voltage is being applied.

The word line WL is connected to respective gate electrodes of the transfer MISFETs Qt1 and Qt2, and controls electrical conduction and non-conduction of the transfer MISFETs Qt1 and Qt2. Namely, when the word line WL is of a high potential ("H"), the transfer MISFETs Qt1 and Qt2 are turned ON so that the flip-flop circuit and the complementary data lines (data lines DL and /DL) are electrically connected to each other. Therefore the potential states ("H" or "L") of the storage nodes A and B appear on the data lines DL and /DL, which in turn are read as information for the memory cell MC.

In order to write information into the memory cell MC, the word line WL is brought to an "H" potential level and the transfer MISFETs Qt1 and Qt2 are respectively brought to an ON state to thereby transfer the information on the data lines DL and /DL to the storage nodes A and B.

A method of manufacturing the SRAM according to the present embodiment will next be explained using FIGS. 2 through 17.

Figure 2:
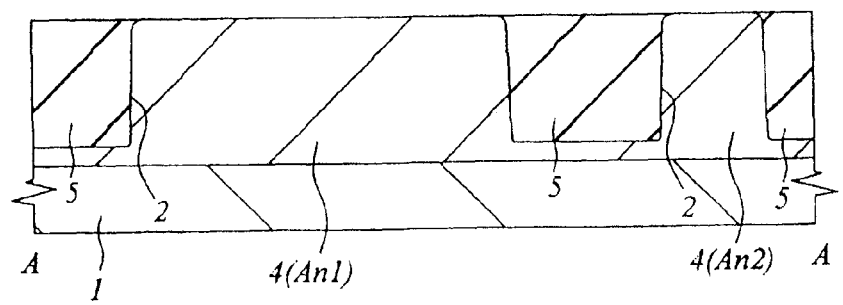
FIG. 2 is a fragmentary cross-sectional view of a substrate showing a method of manufacturing the SRAM illustrating the first embodiment of the present invention.
Figure 3:
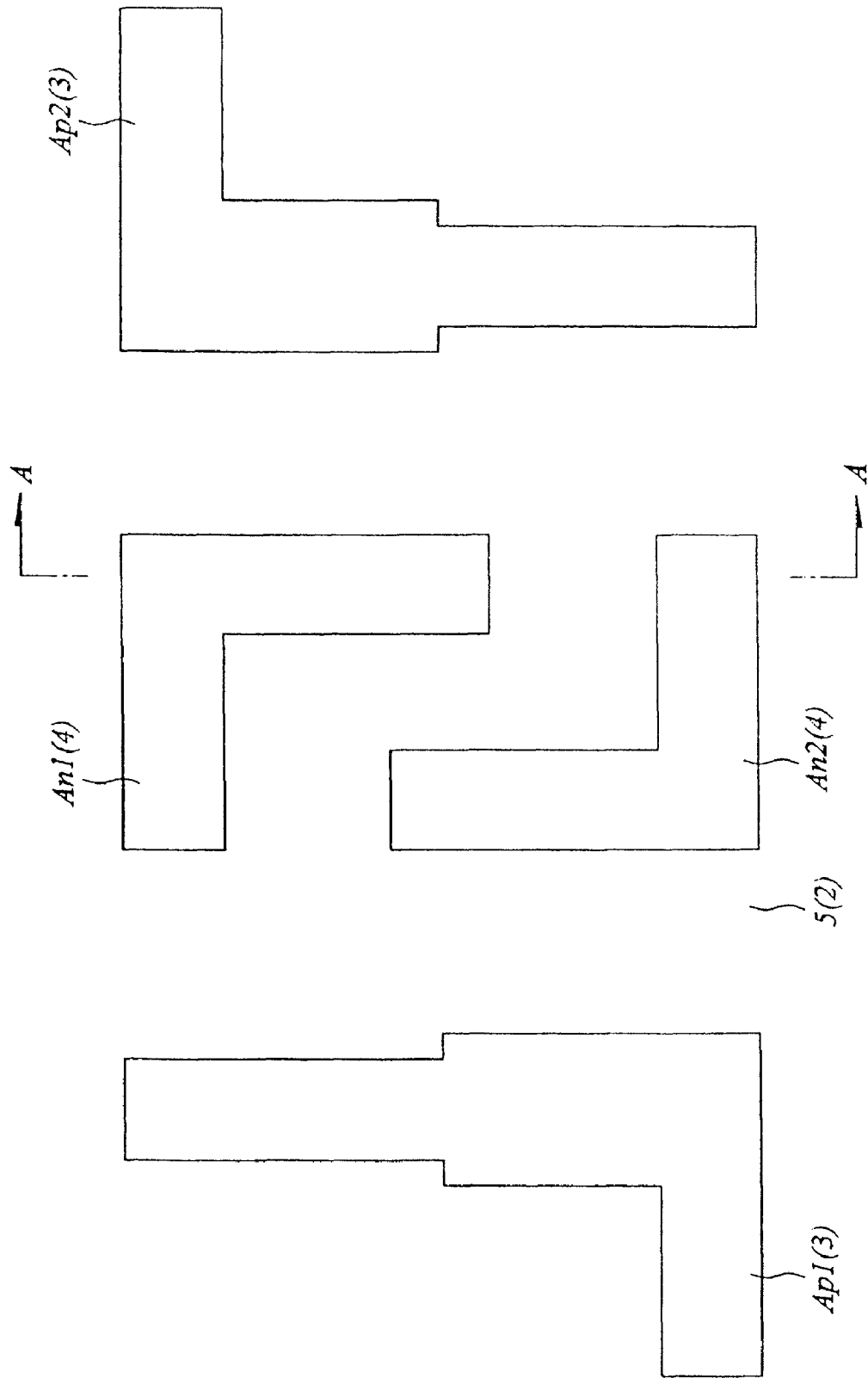
FIG. 3 is a fragmentary plan view of the substrate showing the method of manufacturing the SRAM illustrating the first embodiment of the present invention.

As shown in FIGS. 2 and 3, device isolators 2 are first formed in a semiconductor substrate 1. FIG. 3 is a plan view of a semiconductor substrate showing a region corresponding to about one memory cell, and FIG. 2 is a cross-sectional view of FIG. 3 and corresponds to a cross-section taken along line A-A of FIG. 3. The device isolators 2 are formed as follows. A semiconductor substrate 1 comprising p type monocrystalline silicon having a resistivity which ranges from about 1 Ωcm to about 10 Ωcm, for example, is etched to form device isolation trenches each having a depth of about 250 nm.

Thereafter the semiconductor substrate 1 is subjected to thermal oxidation at about 1000° C. to thereby form a silicon oxide film (not shown) having a thickness of about 10 nm within inner walls of the trenches. The silicon oxide film is formed to recover dry-etching damage that occurred in the inner walls of the trenches and relax stress developed in a boundary face between a silicon oxide film 5 embedded inside the trenches in the next process step and the semiconductor substrate 1.

Next, a silicon oxide film 5 having a thickness ranging from about 450 nm to about 500 nm is deposited over the semiconductor substrate 1 including the interiors of the trenches by a CVD (Chemical Vapor Deposition) method. The silicon oxide film 5 lying over the trenches are polished or ground by a CMP (Chemical Mechanical Polishing) method to flatten its surface.

Next, a p type impurity (boron) and an n type impurity (e.g., phosphor) are ion-implanted in the semiconductor substrate 1 and thereafter diffused by heat treatment at about 1000° C. to thereby form p type wells 3 and n type wells 4 in the semiconductor substrate 1. As shown in FIG. 3, active regions An1, An2, Ap1 and Ap2 corresponding to main surfaces of the two p type wells 3 and two n type wells 4 are formed in the semiconductor substrate 1. The device isolators 2 with the silicon oxide film 5 embedded therein surround these active regions.

As will further be described in detail, n-channel type MISFETs (Qt1 and Qd1) of six MISFETs (Qt1, Qt2, Qd1, Qd2, Qp1 and Qp2) constituting a memory cell MC are formed on the active region Ap1 (p type well 3), and n-channel type MISFETs (Qt2 and Qd2) are formed on the active region Ap2 (p type well 3). Further, a p-channel type MISFET (Qp2) is formed on the active region An1 (n type well 4), and a p-channel type MISFET (Qp1) is formed on the active region An2 (n type well 4).

Next, n-channel type MISFETs (Qt1, Qd1, Qt2 and Qd2) and p-channel type MISFETs (Qp1 and Qp2) are formed on a main surface of the semiconductor substrate 1.

Figure 4:
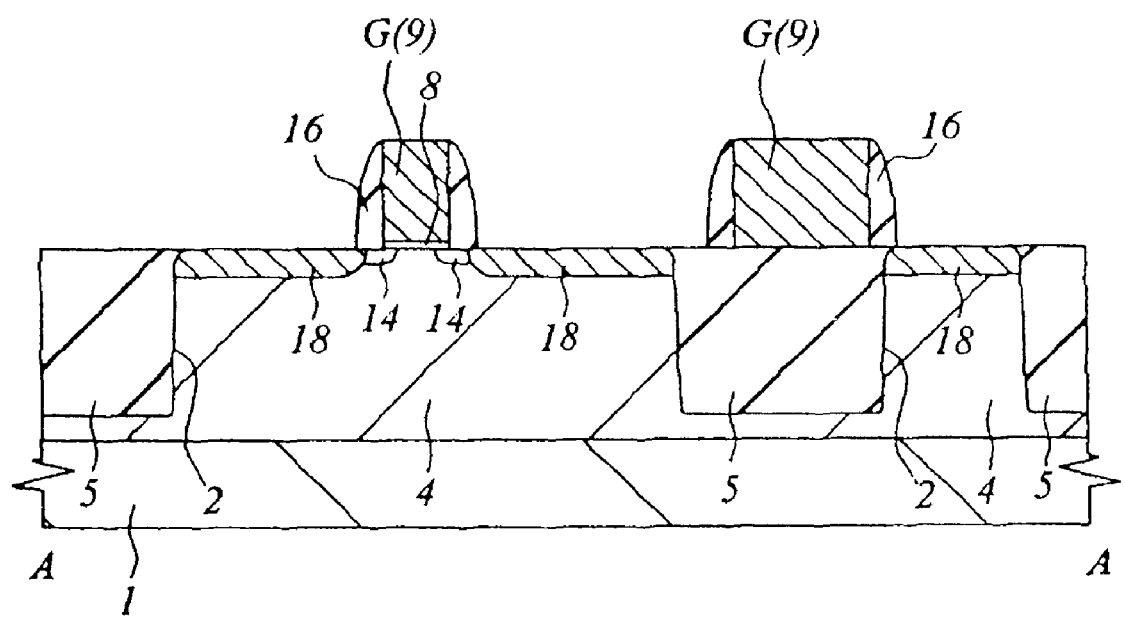
FIG. 4 is a fragmentary cross-sectional view of the substrate showing the method of manufacturing the SRAM illustrating the first embodiment of the present invention.

A cleaning fluid of hydrofluoric acid is first used to wet-clean the surface of the semiconductor substrate 1 (p type wells 3 and n type wells 4). Thereafter as shown in FIG. 4, a clean gate oxide film 8 having a thickness of about 6 nm is formed on the respective surfaces of the p type wells 3 and n type wells 4 under thermal oxidation at about 800° C.

Figure 5:
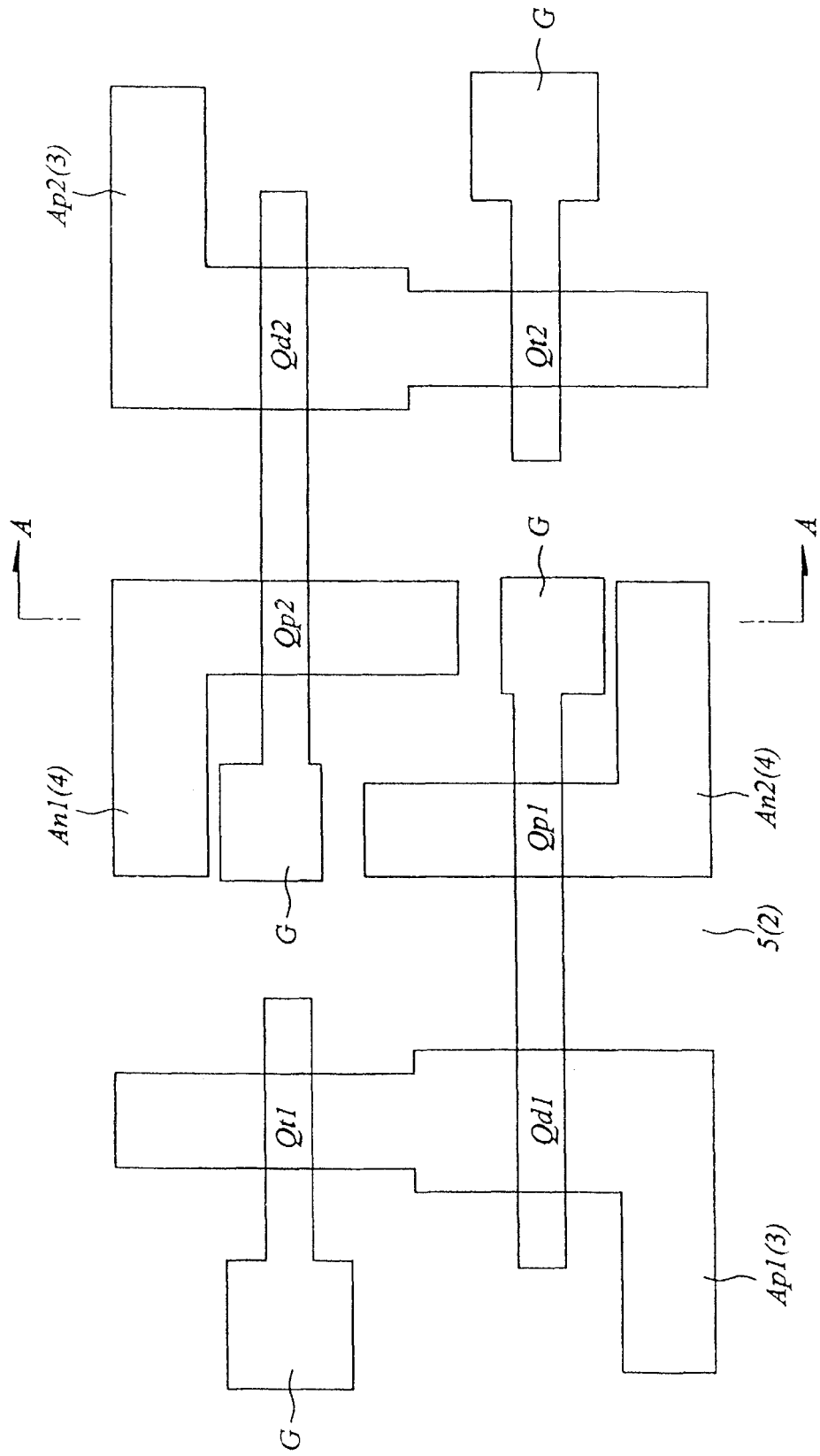
FIG. 5 is a fragmentary plan view of the substrate showing the method of manufacturing the SRAM illustrating the first embodiment of the present invention.

Next, gate electrodes G is formed on the gate oxide film 8. FIG. 5 is a plan view of the semiconductor substrate showing a region equivalent to about one memory cell, and FIG. 4 corresponds to a cross-section taken along line A-A of FIG. 5. The gate electrodes G are formed as follows. A low-resistance polycrystalline silicon film 9 having a thickness of about 100 nm is first deposited over the gate oxide film 8 by the CVD method.

Next, the polycrystalline silicon film 9 is dry-etched with a photoresist film (not shown) as a mask to thereby form gate electrodes G which comprise the polycrystalline silicon film 9. As shown in FIG. 5, a gate electrode G of a transfer MISFET Qt1 and a gate electrode G of a driver MISFET Qd1 are formed on their corresponding active region Ap1, whereas a gate electrode G of a transfer MISFET Qt2 and a gate electrode G of a driver MISFET Qd2 are formed on their corresponding active region Ap2. Further, a gate electrode G of a load MISFET Qp2 is formed on its corresponding active region An1, and a gate electrode G of a load MISFET Qp1 is formed on its corresponding active region An2. These gate electrodes are respectively formed in the direction orthogonal to line A-A in the drawing. The gate electrode G of the load MISFET Qp1 and the gate electrode of the driver MISFET Qd1 are common, and the gate electrode of the load MISFET Qp2 and the gate electrode of the driver MISFET Qd2 are common.

Next, the n type impurity (phosphor) is implanted in both sides of the gate electrode G on each p type well 3 to thereby form n⁻ type semiconductor regions. Further, a p type impurity (boron) is implanted in the n type well 4 from thereabove to thereby form p⁻ type semiconductor regions 14.

Next, a silicon nitride film having a thickness of about 40 nm is deposited on the semiconductor substrate 1 by the CVD method and thereafter anisotropically etched to thereby form sidewall spacers 16 on their corresponding side walls of each gate electrode G.

Next, the n type impurity (phosphor or arsenic) is ion-implanted in the p type wells 3 to thereby form n⁺ type semiconductor regions (source and drain), and a p type impurity (boron) is ion-implanted in the n type wells 4 to thereby form p⁺ type semiconductor regions 18 (source and drain).

The six MISFETs (driver MISFETs Qd1 and Qd2, transfer MISFETs Qt1 and Qt2 and load MISFETs Qp1 and Qp2), which constitute the memory cell MC, are completed in the process steps used up to here.

Figure 6:
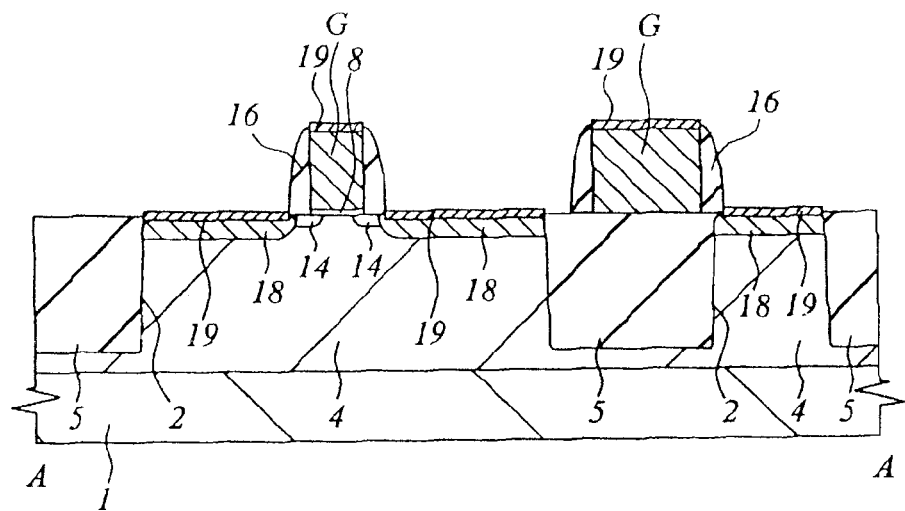
FIG. 6 is a fragmentary cross-sectional view of the substrate showing the method of manufacturing the SRAM illustrating the first embodiment of the present invention.

Subsequently, the surface of the semiconductor substrate 1 is cleaned and thereafter a Co film and a Ti film are successively deposited over the semiconductor substrate 1 by a sputtering method. Next, as shown in FIG. 6, the so-processed semiconductor substrate is heat-treated at 600° C. for one minute to form $CoSi_2$ layers 19 on exposed portions (n⁺ type semiconductor regions and p⁺ type semiconductor regions 18) of the semiconductor substrate 1 and the gate electrodes G.

Next, the non-reacted Co and Ti films are removed by etching. Thereafter the so-processed semiconductor substrate is subjected to heat treatment at temperatures ranging from 700° C. to 800° C. for about one minute to thereby bring each of the $CoSi_2$ layers 19 to a reduction in resistance.

Figure 7:
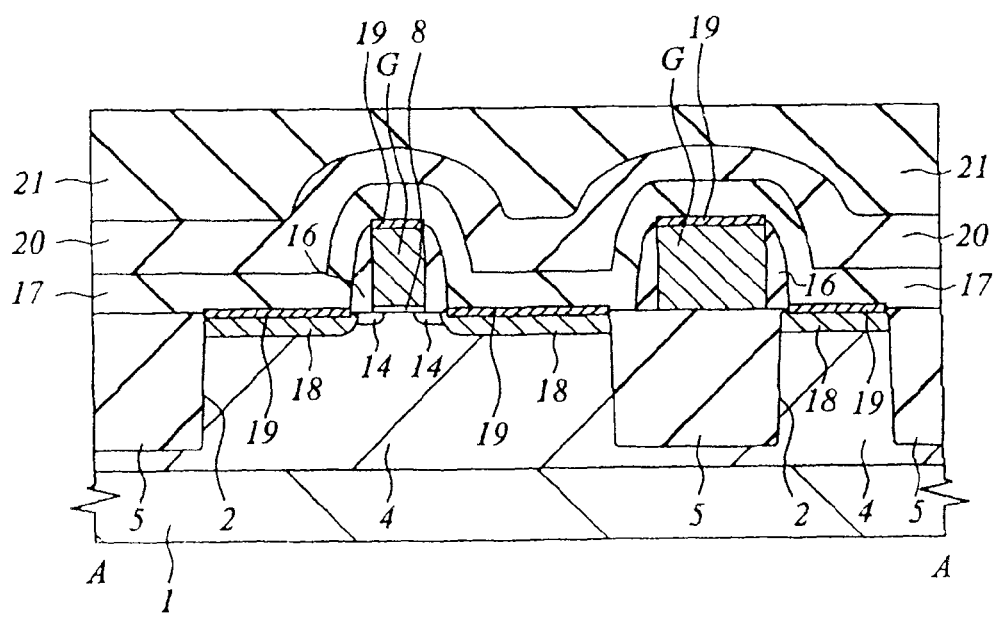
FIG. 7 is a fragmentary cross-sectional view of the substrate showing the method of manufacturing the SRAM illustrating the first embodiment of the present invention.

Next, as shown in FIG. 7, a silicon nitride film 17 having a thickness of about 50 nm is deposited over the semiconductor substrate 1 by the CVD method. Incidentally, the silicon nitride film 17 acts as an etching stopper upon formation of each contact hole C1 or the like to be described later.

Subsequently, a PSG (Phosphor Silicate Glass) film 20 is applied onto the silicon nitride film 17 and heat-treated. After the flattening thereof, a silicon oxide film 21 may be deposited on the PSG film 20. The silicon oxide film 21 is formed by a plasma CVD method with tetraethoxy silane as a material, for example. The PSG film 20, the silicon oxide film 21 and the silicon nitride film 17 result in an interlayer insulating film lying between each gate electrode G and a first-layer wiring M1. A silicon oxide film 21 having a thickness of from about 700 nm to about 800 nm is deposited over the silicon nitride film 17 by the CVD method. Afterwards the surface of the silicon oxide film 21 may be polished by the CMP (Chemical Mechanical Polishing) method to flatten its surface.

Figure 8:
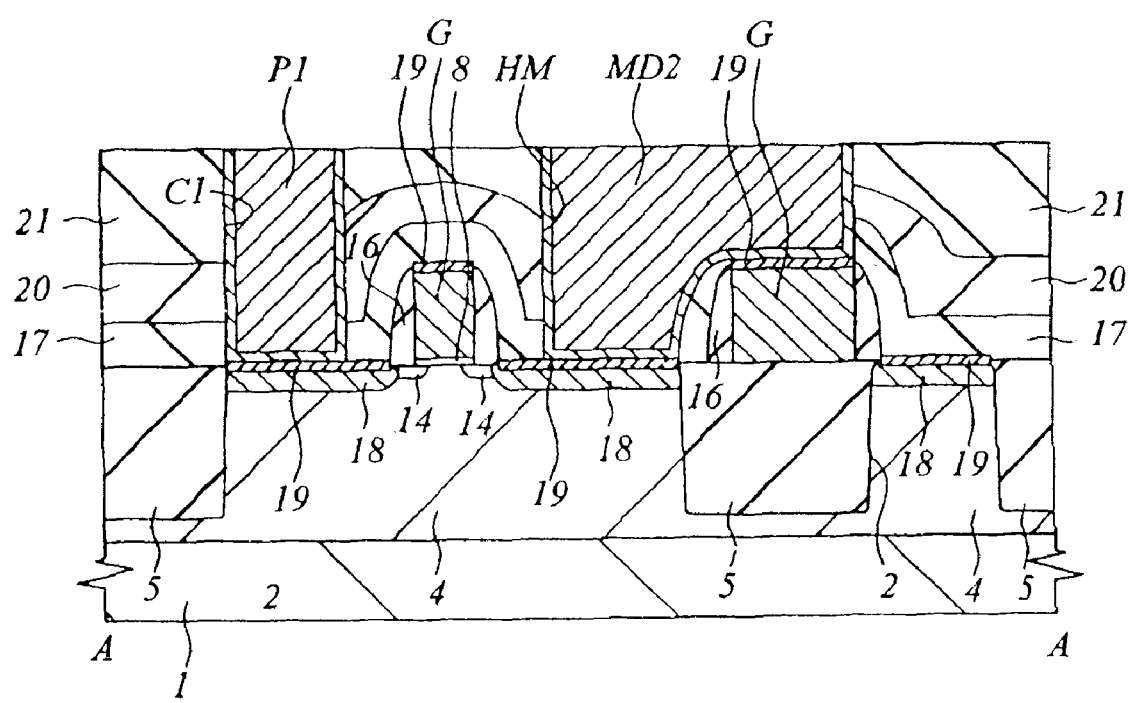
FIG. 8 is a fragmentary cross-sectional view of the substrate showing the method of manufacturing the SRAM illustrating the first embodiment of the present invention.
Figure 9:
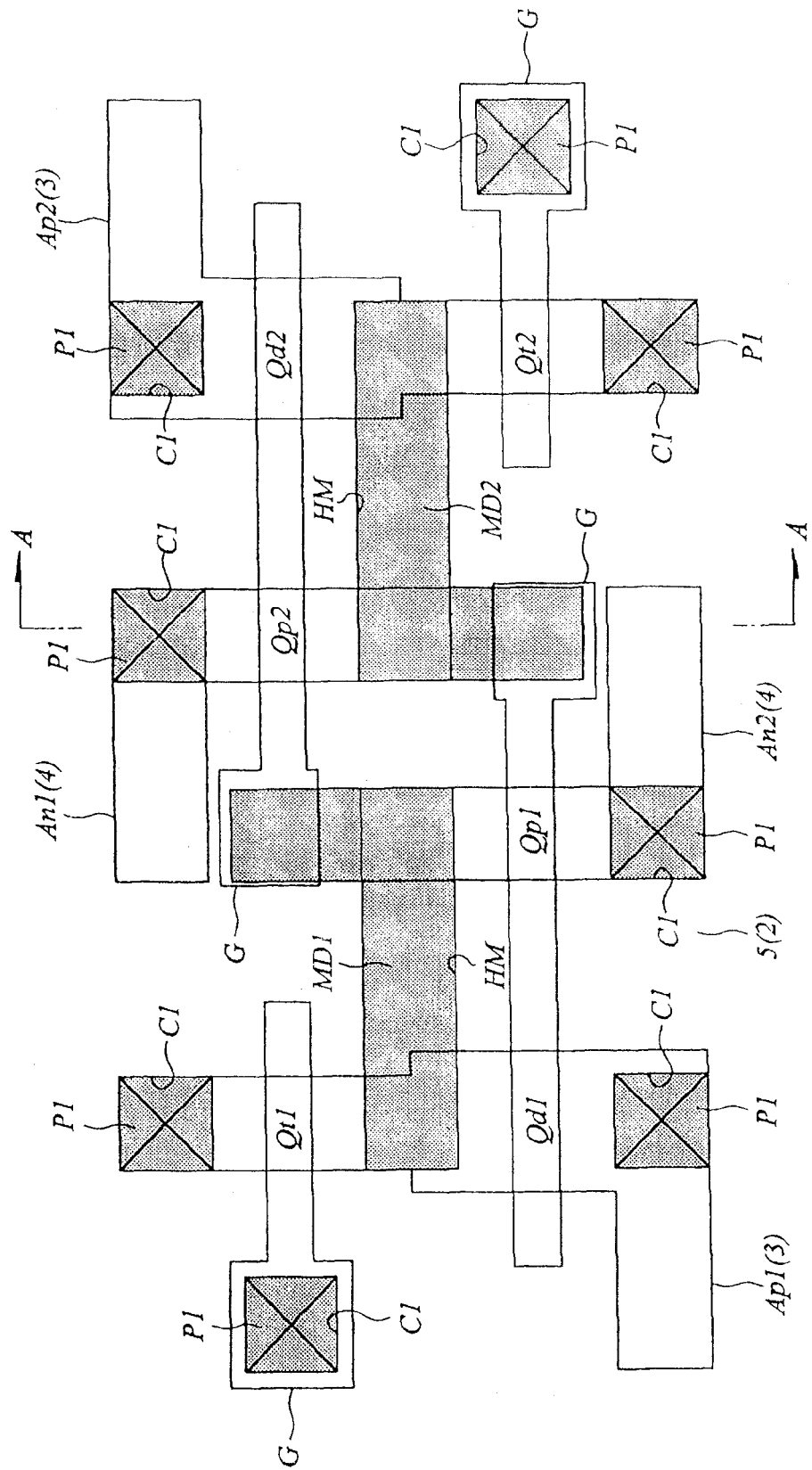
FIG. 9 is a fragmentary plan view of the substrate showing the method of manufacturing the SRAM illustrating the first embodiment of the present invention.

Next, as shown in FIGS. 8 and 9, the silicon oxide film 21 and the PSG film 20 are dry-etched with a photoresist (not shown) as a mask, followed by dry etching of the silicon nitride film 17, thereby forming contact holes C1 and wiring trenches HM on the n⁺ type semiconductor regions (source and drain) and p⁺ type semiconductor regions 18 (source and drain). Further, contact holes C1 are formed over the gate electrodes G of the transfer MISFETs Qt1 and Qt2. Of the two wiring trenches HM in FIG. 9, one wiring trench HM extends from the drain of the driver MISFET Qd1 to above the gate electrode of the driver MISFET Qd2 via above the drain of the load MISFET Qp1. Further, the other wiring trench HM extends from above the drain of the driver MISFET Qd2 to above the gate electrode of the driver MISFET Qd1 via above the drain of the load MISFET Qp2 (see FIG. 9).

Next, a conductive film is embedded in the contact holes C1 and wiring trenches HM to thereby form plugs P1 and wirings MD1 and MD2 (conductive layers). First of all, a Ti film (not shown) having a thickness of about 10 nm, and a TiN film having a thickness of about 50 nm are successively deposited over the silicon oxide film 21 including the interiors of the contact holes C1 and wiring trenches HM and then subjected to heat treatment at temperatures ranging from 500° C. to 700° C. for one minute. Next, a W film is deposited by the CVD method and etched back or subjected to CMP until the surface of the silicon oxide film 21 is exposed, to thereby remove the Ti film, TiN film and W film lying outside the contact holes C1 and wiring trenches HM, whereby the plugs P1 are formed within the contact holes C1 and the wirings MD1 and MD2 are formed within the wiring trenches HM. At this time, the surface of the silicon oxide film 21 and the surfaces of the plugs P1 and wirings MD1 and MD2 substantially coincide with one another.

Figure 10:
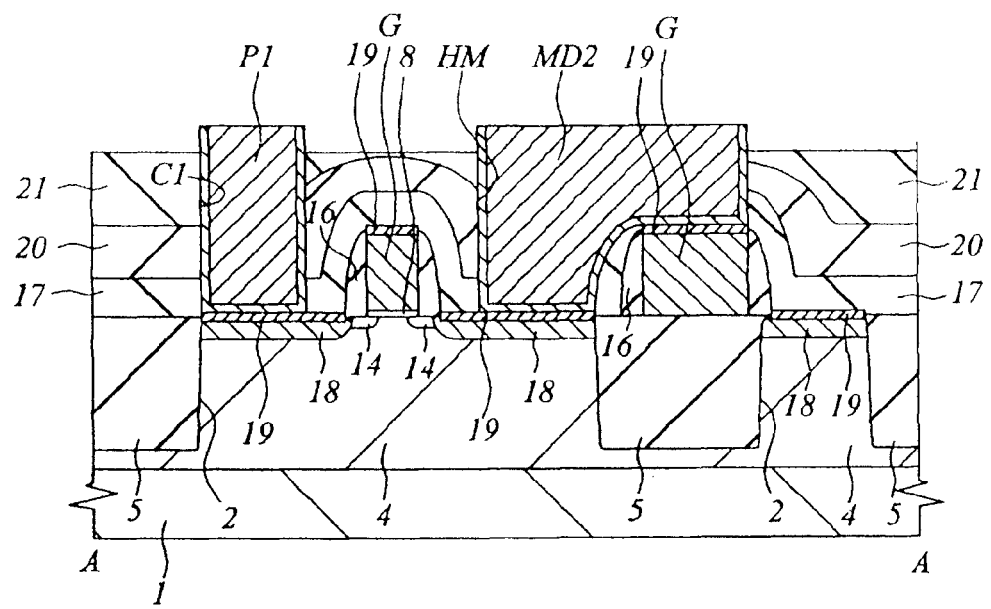
FIG. 10 is a fragmentary cross-sectional view of the substrate showing the method of manufacturing the SRAM illustrating the first embodiment of the present invention.

Next, as shown in FIG. 10, the surface of the silicon oxide film 21 is further etched. At this time, sidewall upper portions of the plugs P1 and wirings MD1 and MD2 are exposed. Incidentally, when the PSG film 20 has been formed, it is necessary to adjust the thickness of the silicon oxide film 21 so as to avoid the exposure of the surface of the PSG film 20.

Figure 11:
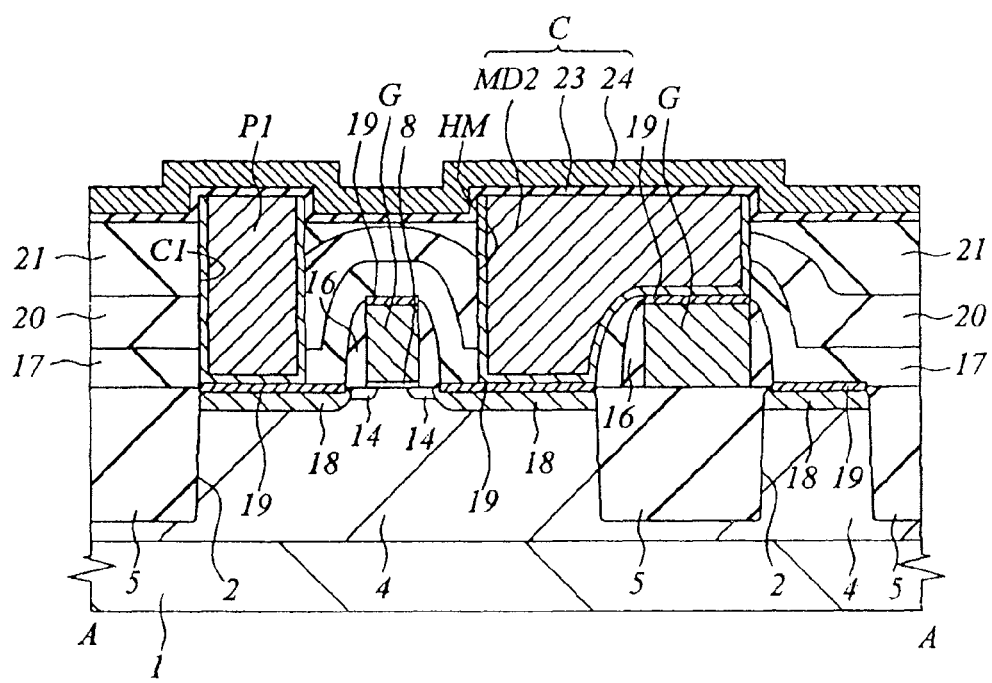
FIG. 11 is a fragmentary cross-sectional view of the substrate showing the method of manufacturing the SRAM illustrating the first embodiment of the present invention.

Next, as shown in FIG. 11, a silicon nitride film 23 is formed on the silicon oxide film 21, the plugs P1 and the wiring MD2. The silicon nitride film 23 is formed between the wirings MD1 and MD2 used as lower electrodes and an upper electrode 24 to be described later, and is used as a capacitive insulating film.

Figure 12:
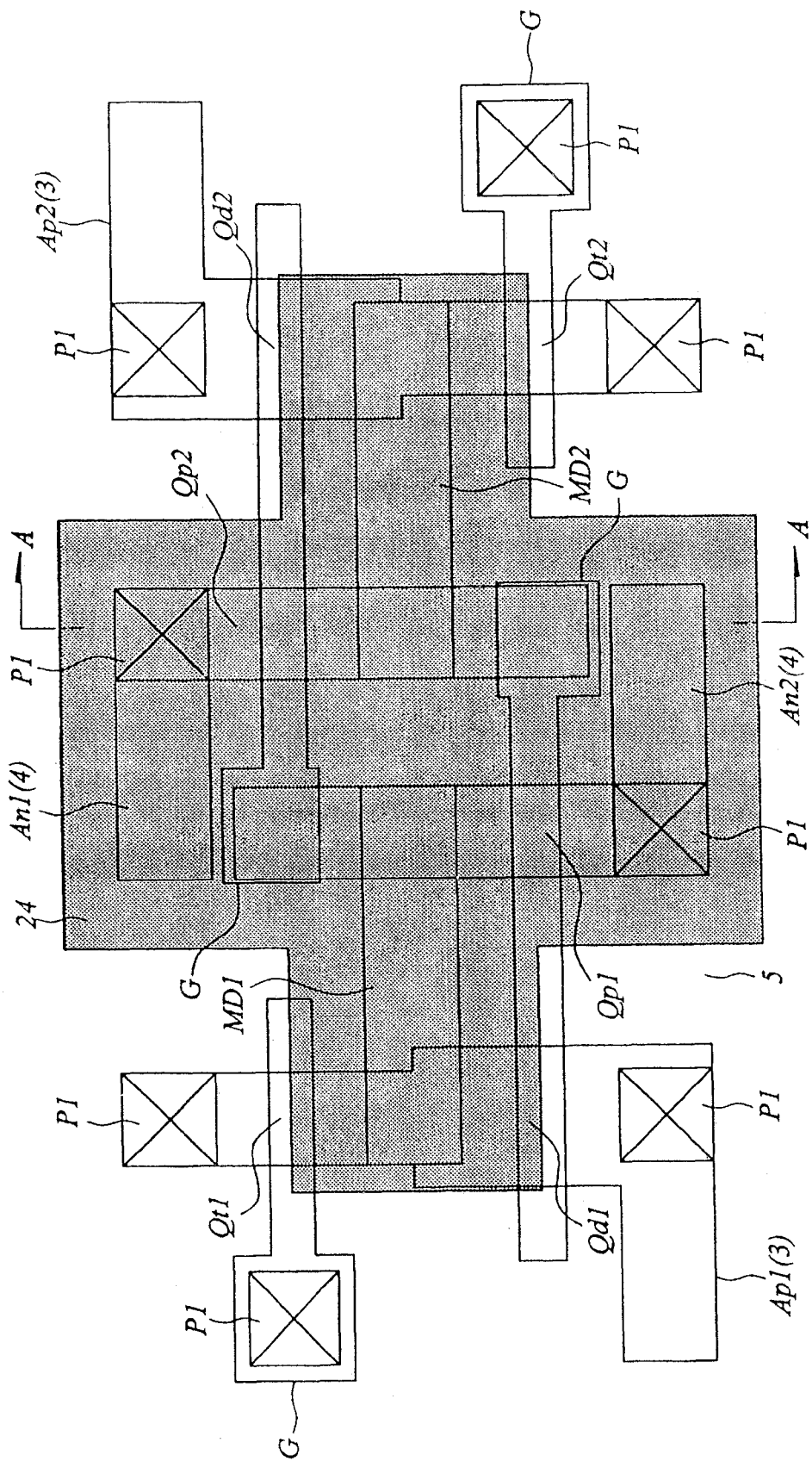
FIG. 12 is a fragmentary plan view of the substrate showing the method of manufacturing the SRAM illustrating the first embodiment of the present invention.

Next, a TiN film is deposited on the silicon nitride film 23 by a sputtering method and subjected to patterning, thereby forming the upper electrode 24 extending over the wirings MD1 and MD2 and the plugs P1 placed on the sources of the load MISFETs Qp1 and Qp2 (see FIG. 12). The upper electrode 24 is patterned so as not to extend over the plugs P1 placed on one ends (the sides connected to data lines) of the transfer MISFETs Qt1 and Qt2 and over the plugs P1 on the sources of the driver MISFETs Qd1 and Qd2.

A capacitor or capacitance C, which comprises the wirings MD1 and MD2 used as the lower electrodes, the silicon nitride film 23 and the upper electrode 24, can be formed in accordance with the above-described process steps.

According to the present embodiment as described above, since the capacitance C connected to the wirings MD1 and MD2 is formed, a soft error produced due to an α ray launched into each memory cell of the SRAM can be reduced. Since the surface of the silicon oxide film 21 is further etched after the formation of the wirings MD1 and MD2, the upper portions of the sidewalls of the wirings MD1 and MD2 are exposed and the silicon nitride film 23 used as the capacitive insulating film can be formed along the sidewalls, thereby making it possible to increase capacitance.

Figure 18:
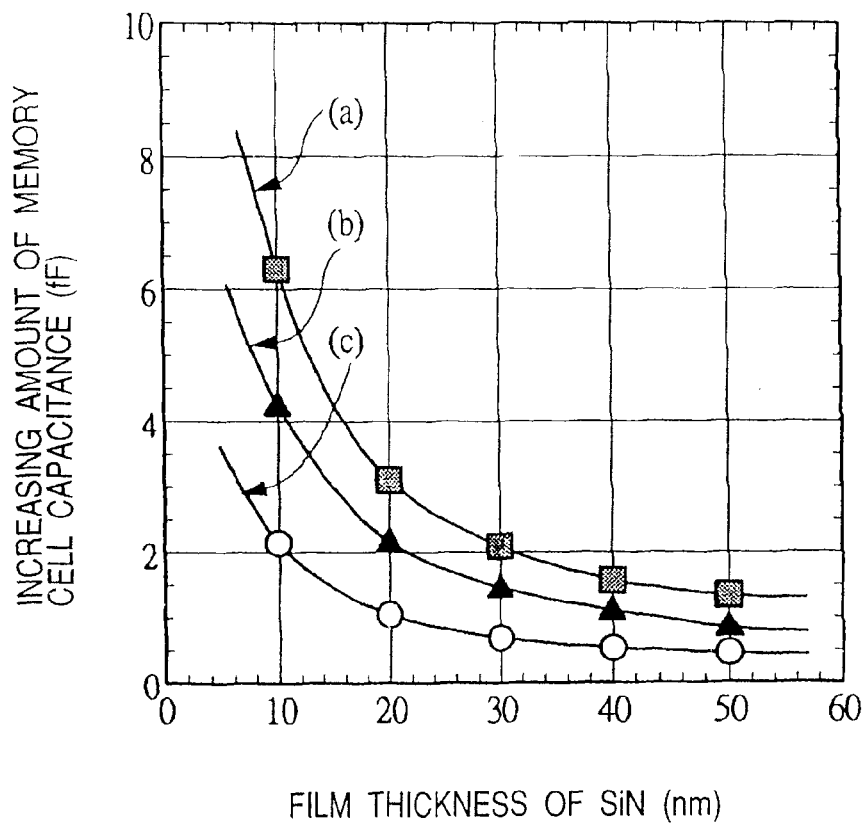
FIG. 18 is a view for describing the effects of the present invention.

FIG. 18 is a diagram showing the relationship between the amount of etching of the surface of the silicon oxide film 21 and the thickness of the silicon nitride film 23, and the amount (fF) of an increase in the capacitance of each memory cell. Graphs (a), (b) and (c) respectively indicate the amounts of increases in capacitance where the amount of etching of the surface of the silicon oxide film 21 is given as 200 nm, 100 nm and 0 nm. When the amount of etching of the surface of the silicon oxide film 21 is given as 200 nm and the thickness of the silicon nitride film 23 is given as 10 nm as shown in FIG. 18, for example, the capacitance can be increased by about 6 fF. On the other hand, when the amount of etching of the surface of the silicon oxide film 21 is given as 100 nm and the thickness of the silicon nitride film is given as 10 nm, the capacitance can be increased by about 4 fF.

Thereafter, first and second layer wirings M1 and M2 are formed over the upper electrode 24 with an interlayer insulating film being interposed therebetween. A process for forming these wirings will be explained continuously.

Figure 13:
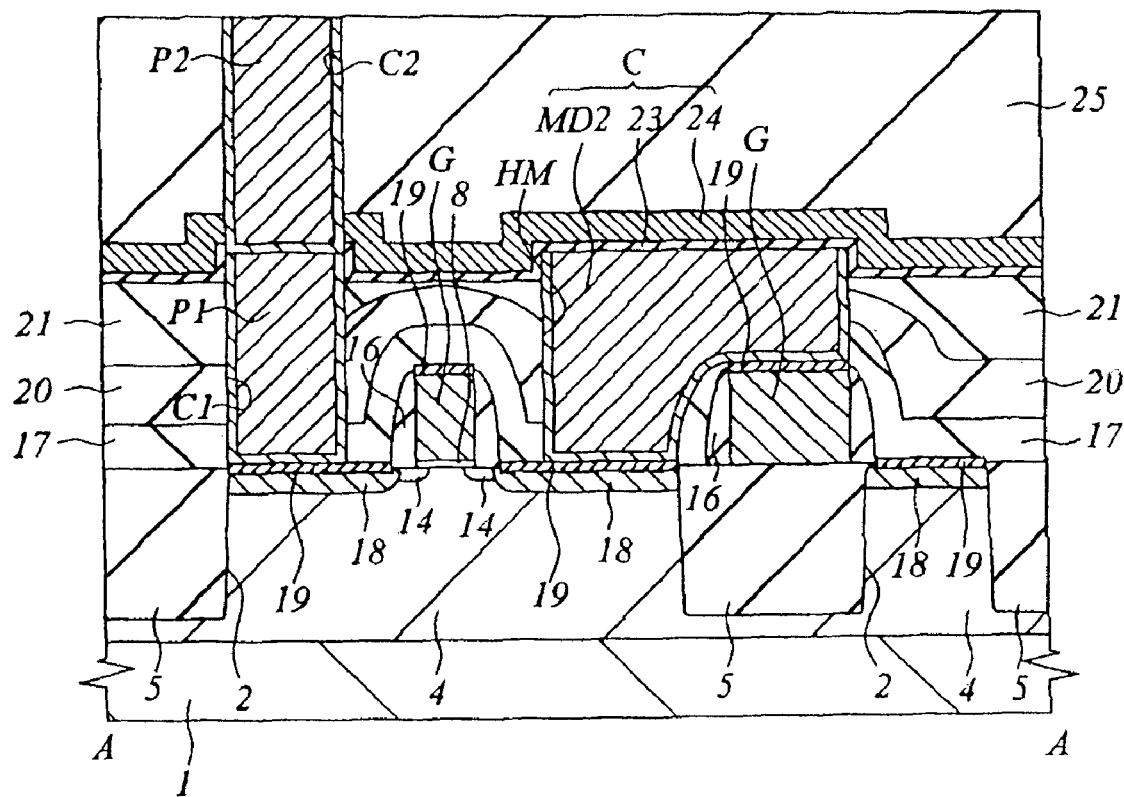
FIG. 13 is a fragmentary cross-sectional view of the substrate showing the method of manufacturing the SRAM illustrating the first embodiment of the present invention.
Figure 14:
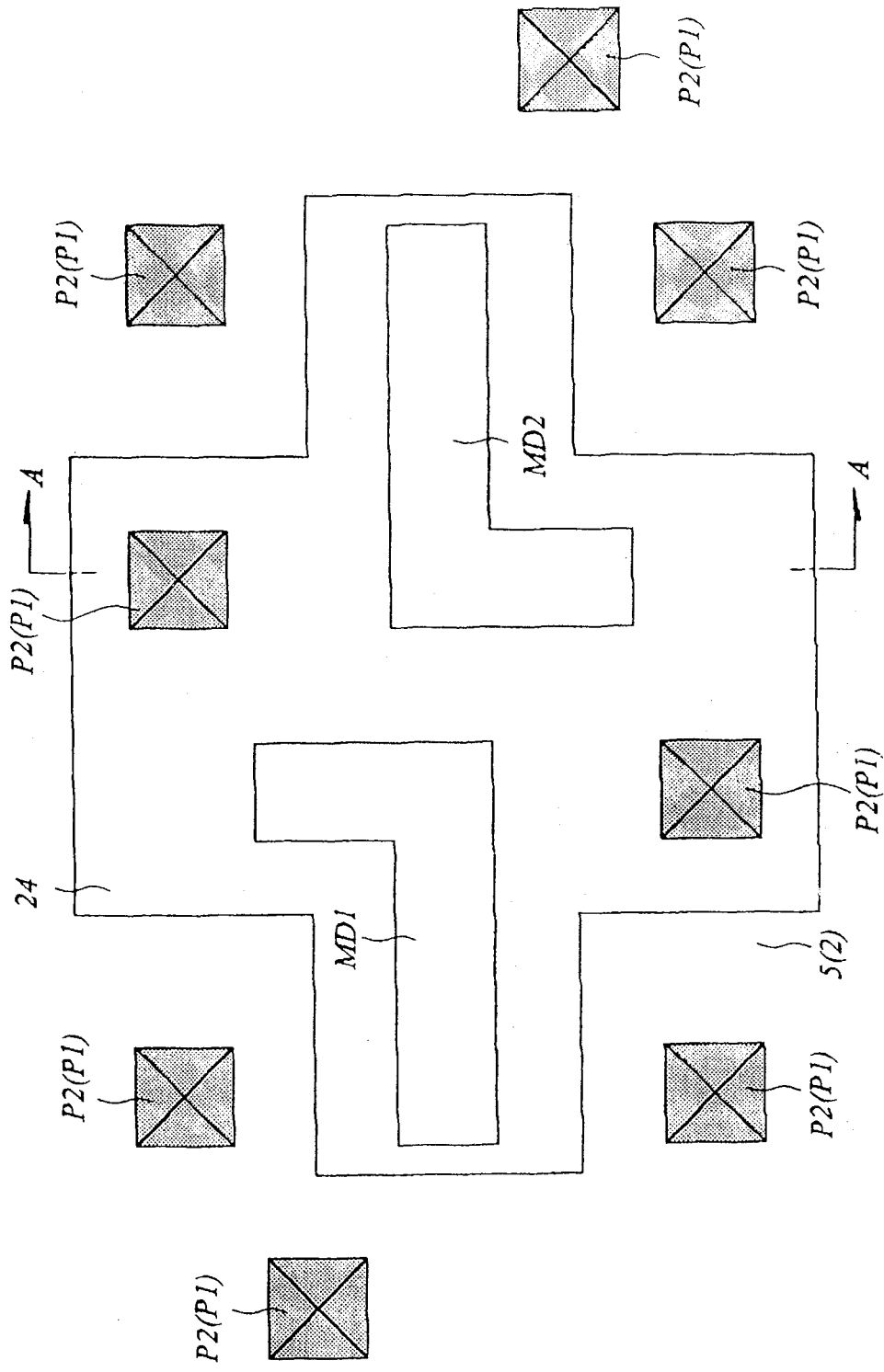
FIG. 14 is a fragmentary plan view of the substrate showing the method of manufacturing the SRAM illustrating the first embodiment of the present invention.

As shown in FIGS. 13 and 14, a silicon oxide film 25 is first deposited on the upper electrode 24 by the CVD method. Next, the silicon oxide film 25 on the plugs P1 is removed by etching to thereby define contact holes C2. Since the silicon nitride film 23 exists on the plugs P1 on the sources of the load MISFETs Qp1 and Qp2, the upper electrode 24 and the silicon nitride film 23 are also removed by etching in addition to the silicon oxide film 25.

Next, a conductive film is embedded in the contact holes C2 to form plugs P2. A Ti film (not shown) having a thickness of about 10 nm and a TiN film having a thickness of about 50 nm are successively formed over the silicon oxide film 25 including the interiors of the contact holes C2 by the sputtering method and subjected to heat treatment at temperatures ranging from 500° C. to 700° C. for one minute. Next, a W film is deposited by the CVD method and etched back or subjected to CMP until the surface of the silicon oxide film 25 is exposed, thereby removing the Ti film, TiN film and W film lying outside the contact holes C2, whereby the plugs P2 are formed. Incidentally, the representation of the gate electrodes G and the active region An1, etc. is omitted from a plan view of FIG. 14.

Figure 15:
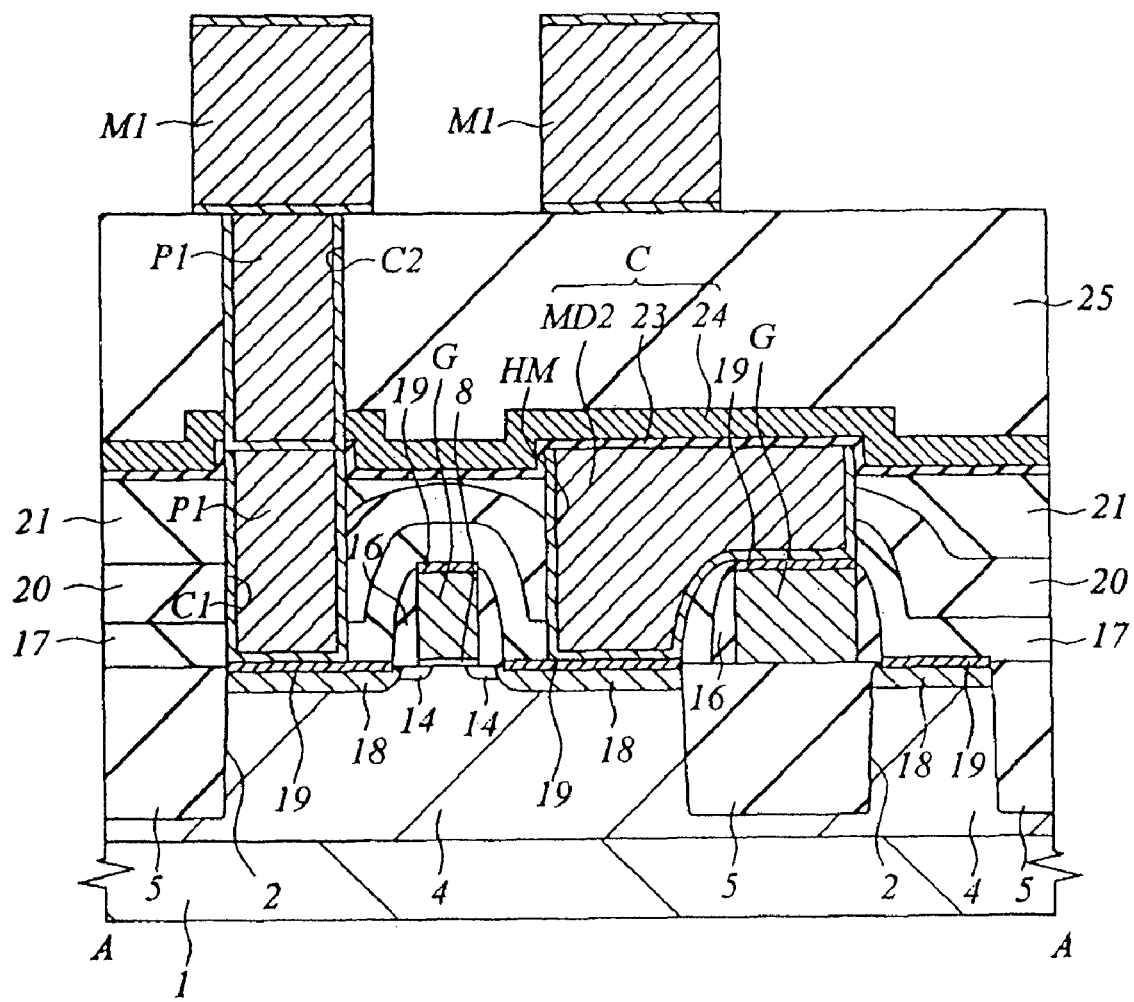
FIG. 15 is a fragmentary cross-sectional view of the substrate showing the method of manufacturing the SRAM illustrating the first embodiment of the present invention.
Figure 16:
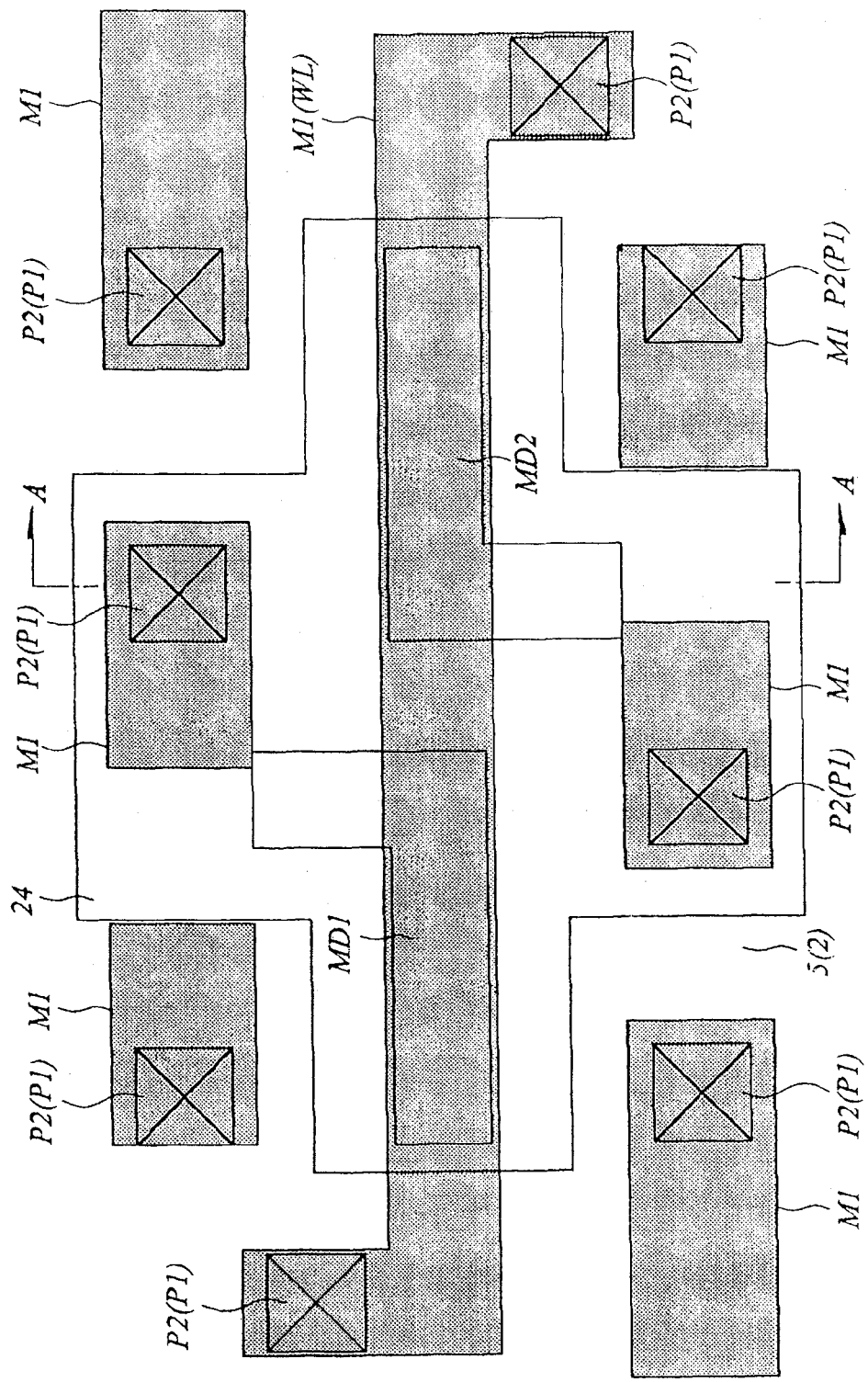
FIG. 16 is a fragmentary plan view of the substrate showing the method of manufacturing the SRAM illustrating the first embodiment of the present invention.

Subsequently, first layer wirings M1 are formed on the silicon oxide film 25 and the plugs P2 as shown in FIGS. 15 and 16. A Ti film (not shown) having a thickness of about 10 nm and a TiN film having a thickness of about 50 nm are successively deposited thereon by the sputtering method and subjected to heat treatment at temperatures ranging from 500° C. to 700° C. for one minute. Next, a W film is deposited thereon by the CVD method and subjected to patterning to thereby form first layer wirings M1. Of the first layer wirings M1, the first layer wiring M1 for connecting the gate electrodes G of the transfer MISFETs Qt1 and Qt2 via the plugs P1 result in a word line WL.

Figure 17:
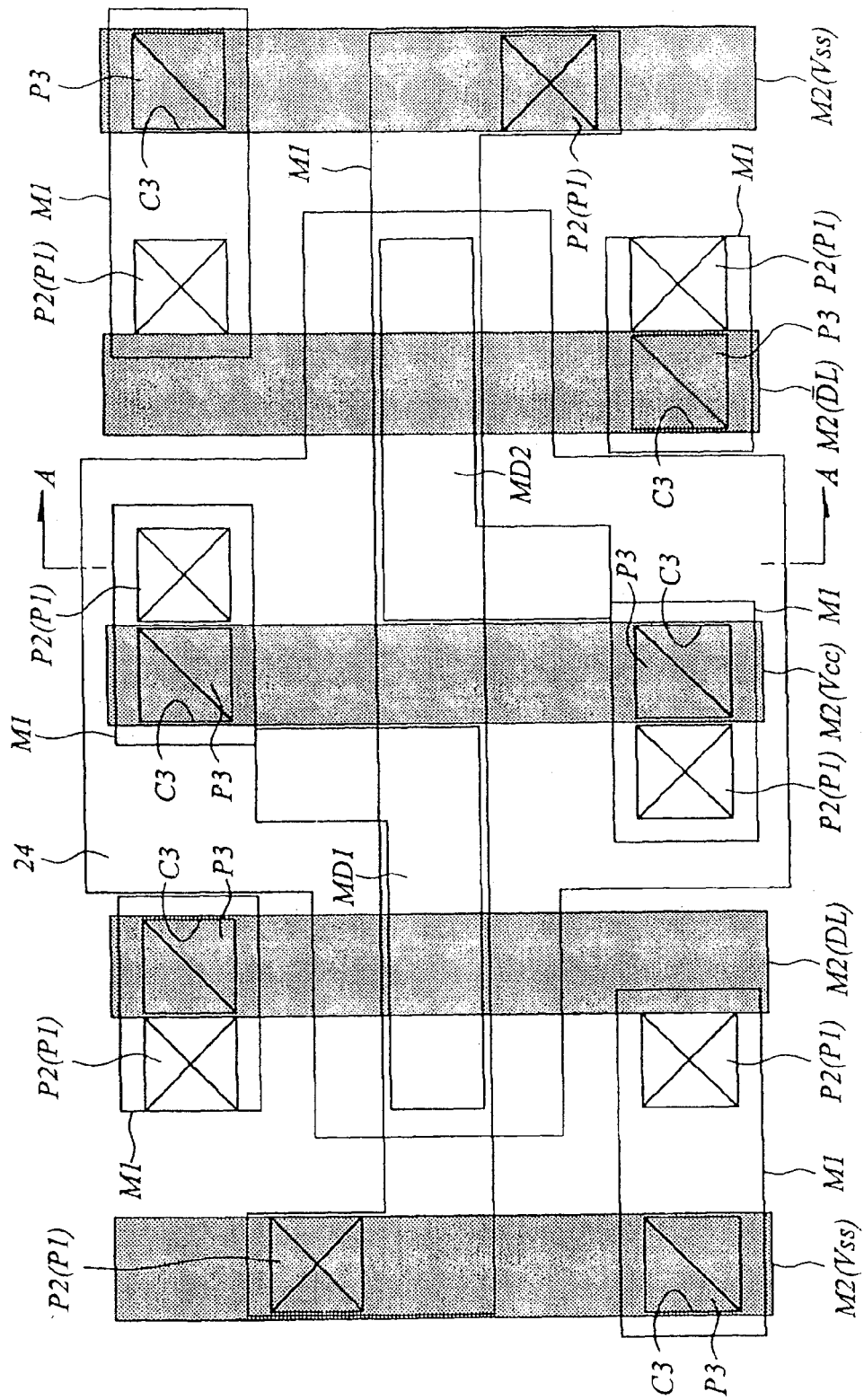
FIG. 17 is a fragmentary plan view of the substrate showing the method of manufacturing the SRAM illustrating the first embodiment of the present invention.

Next, as shown in FIG. 17, a silicon oxide film 27 (not shown in FIG. 17) is deposited on the first layer wirings M1 and the silicon oxide film 25 by the CVD method. Next, the silicon oxide film 27 on the first layer wirings M1 is removed by etching to thereby define contact holes C3.

Next, a conductive film is embedded in the contact holes C3 to form plugs P3. The plugs P3 are formed in a manner similar to the plugs P2.

Subsequently, second layer wirings M2 are formed on the silicon oxide film 27 and the plugs P3. First of all, a Ti film (not shown) having a thickness of about 10 nm and a TiN film having a thickness of about 50 nm are successively formed thereon by the sputtering method and heated at temperatures ranging from 500° C. to 700° C. for one minute. Next, a W film is deposited by the CVD method and subjected to patterning to thereby form second layer wirings M2. A reference potential (Vss) is supplied to the sources of the driver MISFETs Qd1 and Qd2 through the second layer wirings M2.

Further, a source potential (Vcc) is supplied to the sources of the load MISFETs Qp1 and Qp2 through the second layer wirings M2. Thus since the upper electrode 24 is in close proximity to the sidewalls of the plugs P2 connected to the sources of the load MISFETs Qp1 and Qp2 as shown in FIG. 13, it is supplied with the source potential (Vcc). As a result, the above-described capacitance C results in a capacitor or capacitance connected between the storage node A or B and the source potential (Vcc) in FIG. 1.

The second layer wirings connected to one ends of the driver MISFETs Qd1 and Qd2 result in data lines (DL and /DL).

According to the above process steps, the SRAM memory cell described using FIG. 1 is substantially completed.

Second Embodiment

A method of manufacturing a SRAM according to the present embodiment will be explained with reference to FIGS. 19 through 22. Incidentally, since process steps up to the formation of the plugs P1 and the wirings MD1 and MD2, described using FIGS. 2 through 9 are similar to the first embodiment, the description thereof will be omitted.

Figure 19:
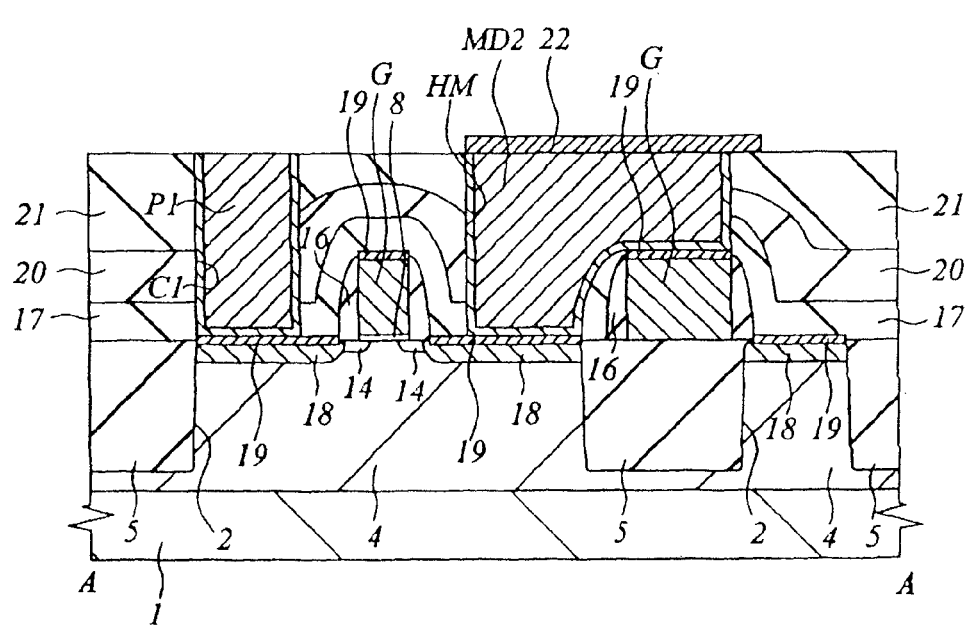
FIG. 19 is a fragmentary cross-sectional view of a substrate showing a method of manufacturing a SRAM illustrating a second embodiment of the present invention.
Figure 20:
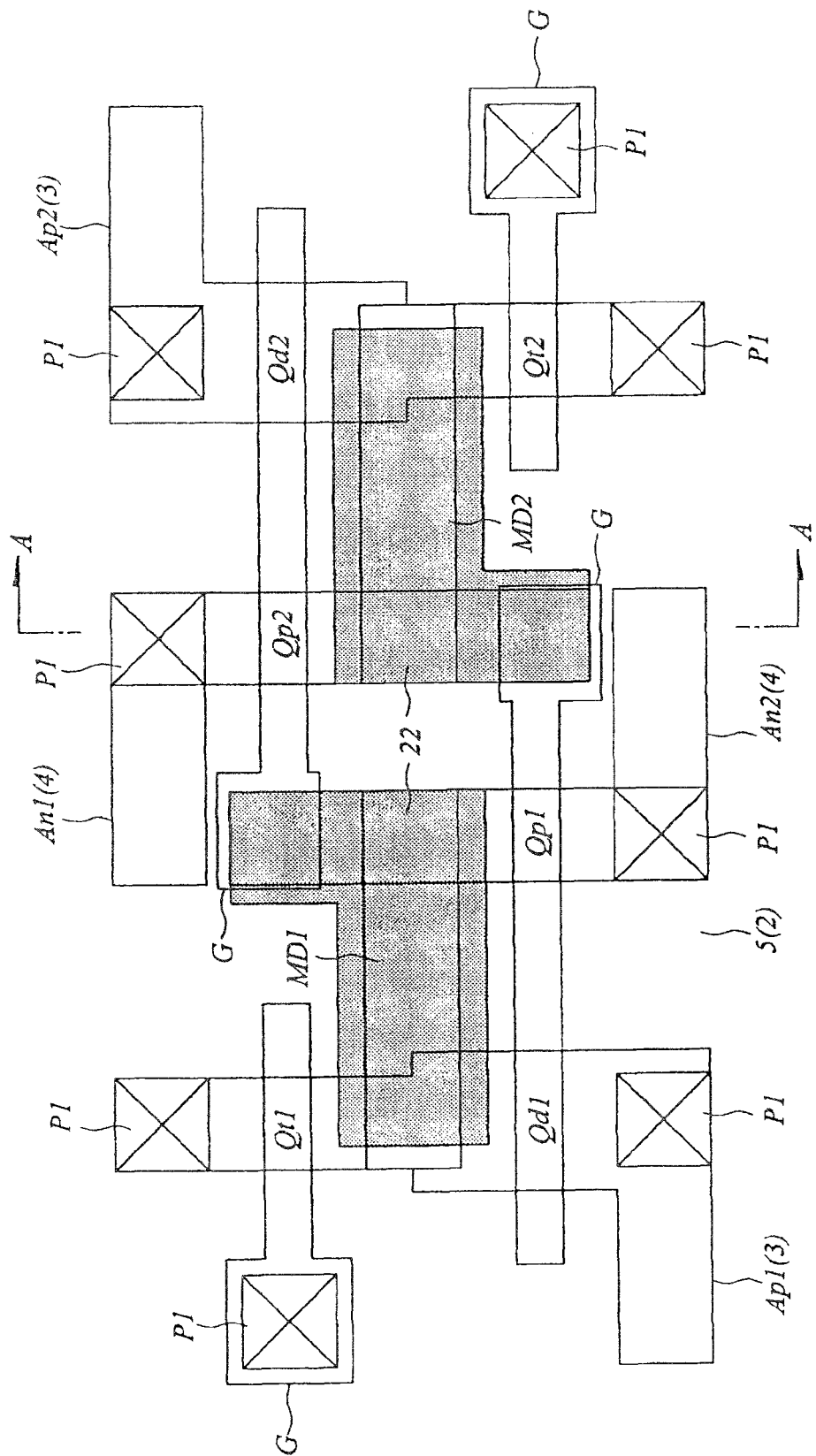
FIG. 20 is a fragmentary plan view of the substrate showing the method of manufacturing the SRAM illustrative of the second embodiment of the present invention.

The semiconductor substrate 1 shown in FIGS. 8 and 9, which has been described in the first embodiment, is first prepared. As shown in FIG. 19, a TiN film is deposited on the silicon oxide film 21, plugs P1 and wiring MD2 by a sputtering method and subjected to patterning to thereby form lower electrodes 22 on the wirings MD1 and MD2. Areas for forming the lower electrodes 22 are respectively larger than the areas for forming the wirings MD1 and MD2 (see FIG. 20).

Figure 21:
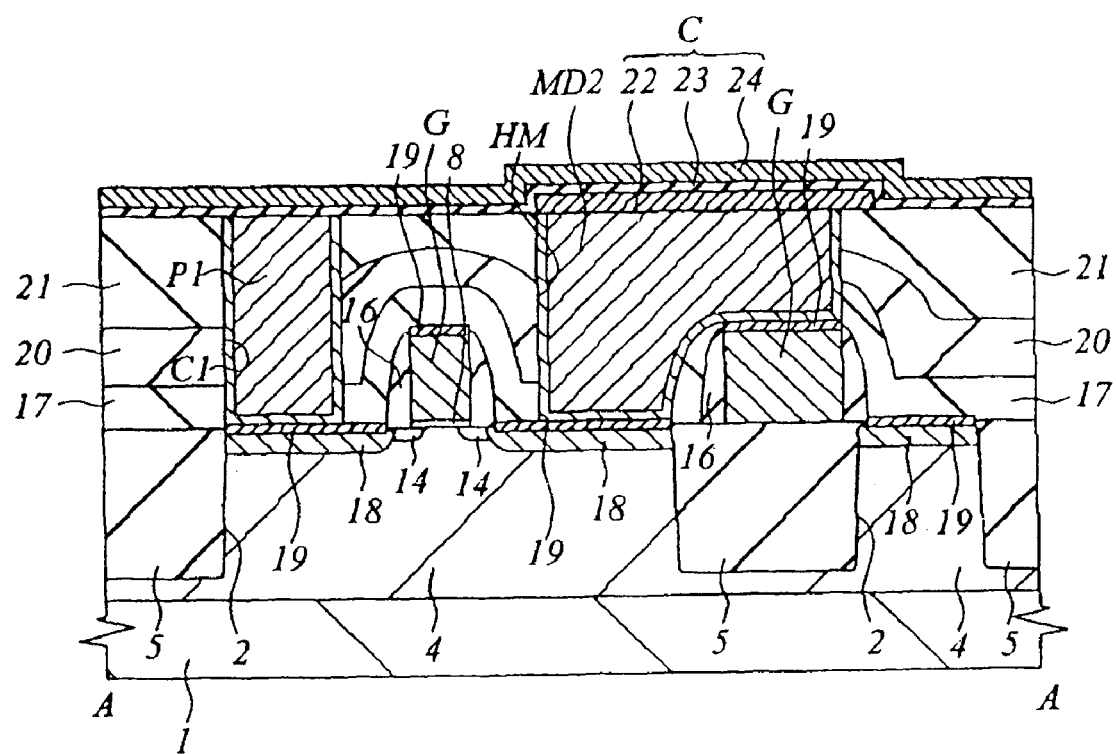
FIG. 21 is a fragmentary cross-sectional view of the substrate showing the method of manufacturing the SRAM illustrating the second embodiment of the present invention.
Figure 22:
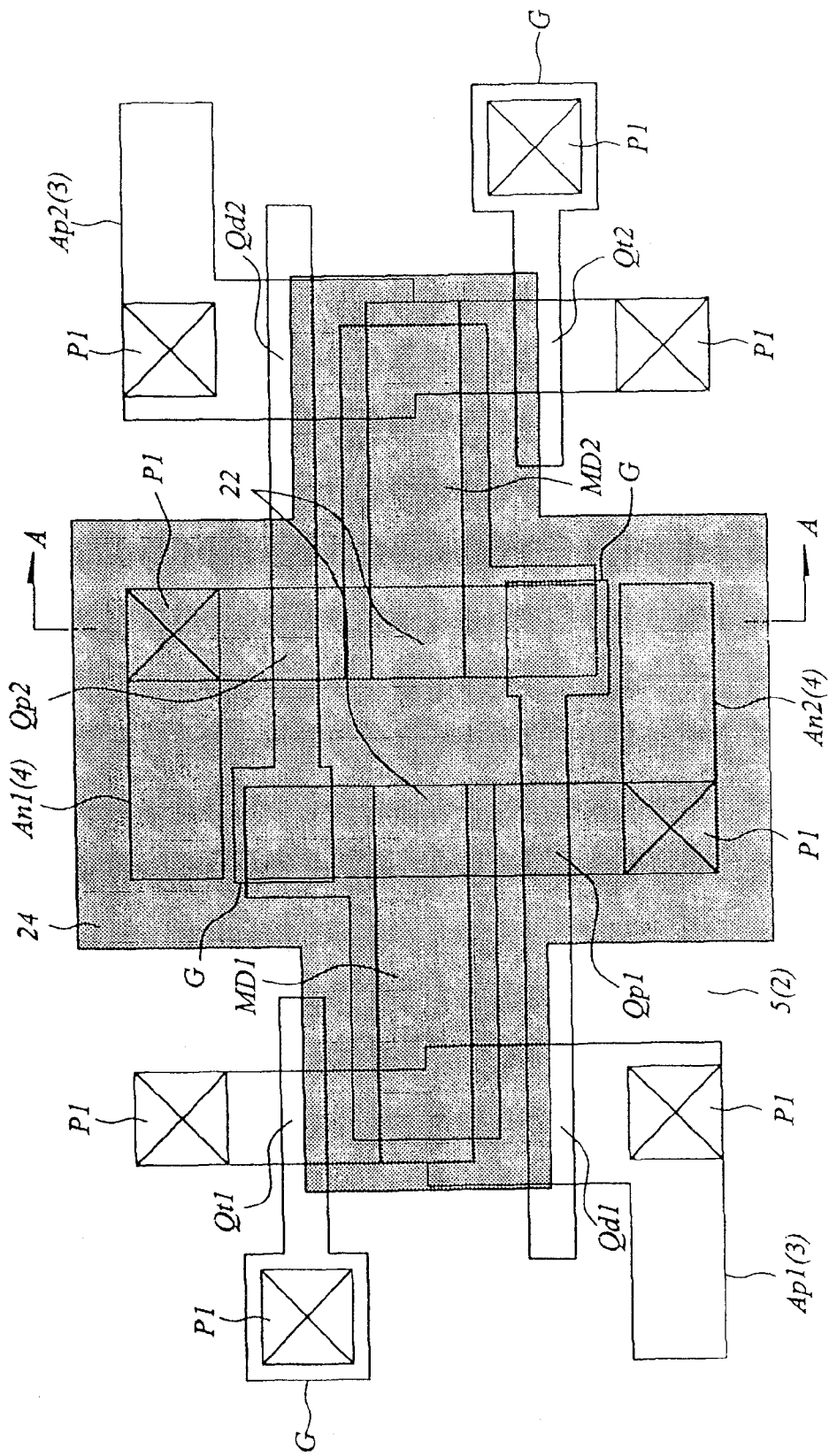
FIG. 22 is a fragmentary plan view of the substrate showing the method of manufacturing the SRAM illustrating the second embodiment of the present invention.

Next, as shown in FIGS. 21 and 22, a silicon nitride film 23 is formed on the lower electrodes 22 and the silicon oxide film 21. The silicon nitride film 23 is formed between the lower electrodes 22 and an upper electrode 24 to be described later and results in a capacitive insulating film.

Next, a TiN film is deposited on the silicon nitride film 23 by the sputtering method and subjected to patterning to thereby form the upper electrode 24 which extends over the lower electrodes 22 and the plugs P1 on the sources of the load MISFETs Qp1 and Qp2. The upper electrode 24 is patterned so as not to extend over the plugs P1 placed on one ends (the sides connected to data lines) of the transfer MISFETs Qt1 and Qt2 and over the plugs P1 on the sources of the driver MISFETs Qd1 and Qd2.

A capacitor or capacitance C, which comprises the lower electrodes 22, silicon nitride film 23 and upper electrode 24, can be formed in accordance with the above-described process steps.

According to the present embodiment as described above, since the capacitance C connected to the wirings MD1 and MD2 is formed, a soft error produced due to an α ray launched into each memory cell of the SRAM can be reduced. Since the areas for forming the lower electrodes 22 are set larger than the areas for forming the wirings MD1 and MD2, the capacitance can be increased.

Next, a silicon oxide film 25 is deposited on the upper electrode 24 by a CVD method, followed by formation of first and second layer wirings M1 and M2. However, since process steps for forming these are similar to those employed in the first embodiment described with reference to FIGS. 13 through 17, the description thereof will be omitted.

Third Embodiment

Figure 23:
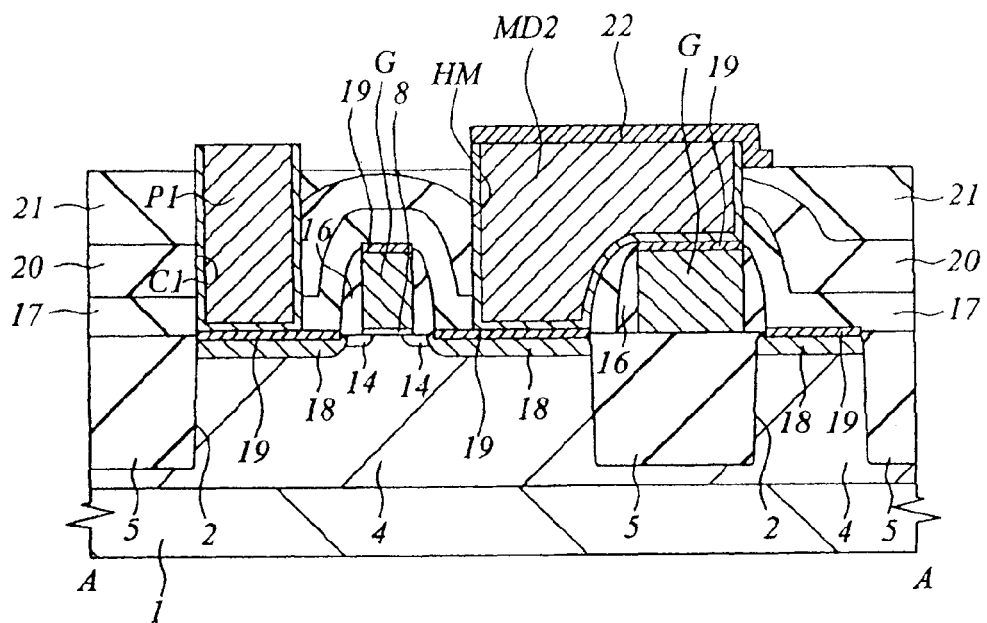
FIG. 23 is a fragmentary cross-sectional view of a substrate showing a method of manufacturing a SRAM illustrating a third embodiment of the present invention.

A method of manufacturing a SRAM according to the present embodiment will be described with reference to FIGS. 23 and 24. Incidentally, since process steps up to the etching of the surface of the silicon oxide film 21, which have been described using FIGS. 2 through 10, are similar to those employed in the first embodiment, the description thereof will be omitted.

The semiconductor substrate 1 shown in FIG. 10, which has been described in the first embodiment, is first prepared. As shown in FIG. 23, a TiN film is deposited on the silicon oxide film 21, plugs P1 and wirings MD2 by a sputtering method and subjected to patterning to thereby form lower electrodes 22 on their corresponding wirings MD1 and MD2. Since, at this time, a step occurs between the surface of each of the wirings MD1 and MD2 and the surface of the silicon oxide film 21, a step corresponding to such a step occurs even in the surface of each lower electrode 22. Areas for forming the lower electrodes 22 are respectively larger than areas for forming the wirings MD1 and MD2 (similar to FIG. 20).

Figure 24:
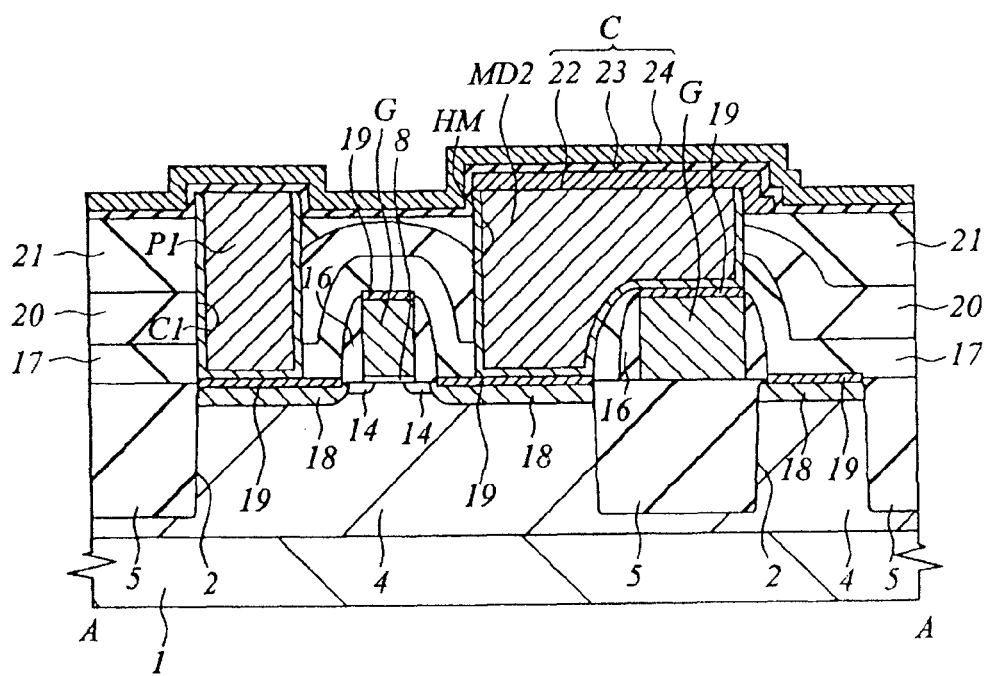
FIG. 24 is a fragmentary cross-sectional view of the substrate showing the method of manufacturing the SRAM illustrating the third embodiment of the present invention.

Next, as shown in FIG. 24, a silicon nitride film 23 is formed on the lower electrodes 22, silicon oxide film 21 and plugs Pi. The silicon nitride film 23 is formed between the lower electrodes 22 and an upper electrode 24 to be described later and results in a capacitive insulating film.

Next, a TiN film is deposited on the silicon nitride film 23 by the sputtering method and subjected to patterning to thereby form the upper electrode 24 which extends over the wirings MD1 and MD2 and the plugs P1 on the sources of the load MISFETs Qp1 and Qp2 (similar to FIG. 22). The upper electrode 24 is patterned so as not to extend over the plugs P1 placed on one ends (the sides connected to data lines) of the transfer MISFETs Qt1 and Qt2 and over the plugs P1 on the sources of the driver MISFETs Qd1 and Qd2.

A capacitor or capacitance C, which comprises the lower electrodes 22, silicon nitride film 23 and upper electrode 24, can be formed in accordance with the above-described process steps.

According to the present embodiment as described above, since the capacitance C connected to the wirings MD1 and MD2 is formed, a soft error produced due to an α ray launched into each memory cell of the SRAM can be reduced. Since, at this time, the step associated with the step between the surface of each of the wirings MD1 and MD2 and the surface of the silicon oxide film 21 has occurred in the surface of each lower electrode 22, the lower electrodes 22 and the silicon nitride film 23 used as the capacitive insulating film can be formed along the step, and hence the capacitance can be increased. Since the areas for forming the lower electrodes 22 are set larger than the areas for forming the wirings MD1 and MD2, the capacitance can be increased.

Next, a silicon oxide film 25 is deposited on the upper electrode 24 by a CVD method, followed by formation of first and second layer wirings M1 and M2. However, since process steps for forming these are similar to those employed in the first embodiment described with reference to FIGS. 13 through 17, the description thereof will be omitted.

Fourth Embodiment

A method of manufacturing a SRAM according to the present embodiment will be explained. Incidentally, since process steps up to the formation of the silicon oxide film 21, described using FIGS. 2 through 7 are similar to those employed in the first embodiment, the description thereof will be omitted.

Figure 25:
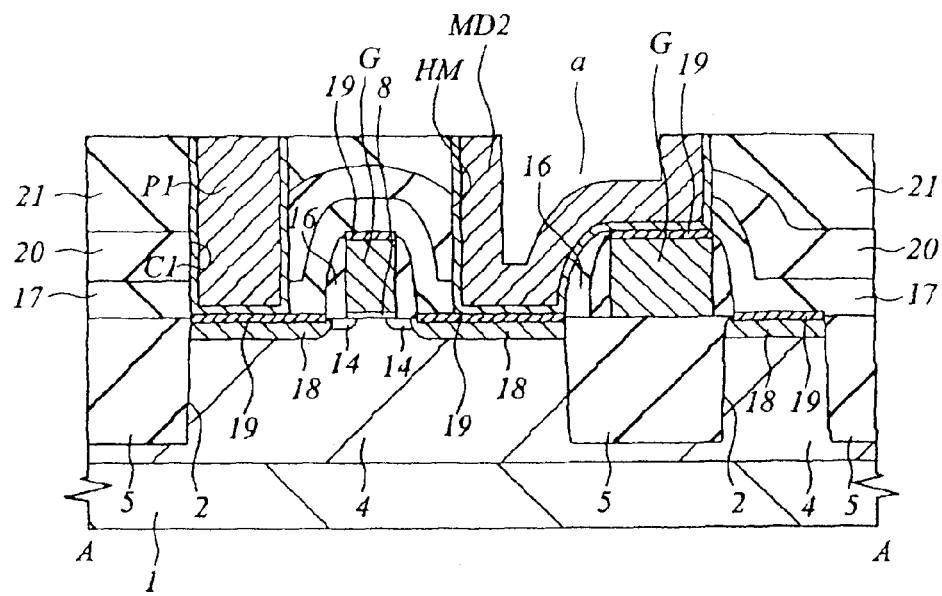
FIG. 25 is a fragmentary cross-sectional view of a substrate showing a method of manufacturing a SRAM illustrating a fourth embodiment of the present invention.

The semiconductor substrate 1 shown in FIG. 7, which has been described in the first embodiment, is first prepared. As shown in FIG. 25, the silicon oxide film 21 and the PSG film 20 are dry-etched with a photoresist film (not shown) as a mask and subsequently the silicon nitride film 17 is dry-etched to thereby form contact holes C1 and wiring trenches HM on the $n^+$ type semiconductor regions (source and drain) and $p^+$ type semiconductor regions 18 (source and drain). Further, contact holes C1 are formed on their corresponding gate electrodes G (identical to FIG. 9). Of the two wiring trenches in the drawing, one wiring trench HM extends from above the drain of the driver MISFET Qd1 to above the gate electrode of the driver MISFET Qd2 via the drain of the load MISFET Qp1. The other wiring trench HM extends from above the drain of the driver MISFET Qd2 to above the gate electrode of the driver MISFET Qd1 via the drain of the load MISFET Qp2.

Next, a Ti film (not shown) having a thickness of about 10 nm and a TiN film having a thickness of about 50 nm are successively formed over the silicon oxide film 21 including the interiors of the contact holes C1 and wiring trenches HM by a sputtering method and subjected to heat treatment at temperatures ranging from 500° C. to 700° C. for one minute. Next, a W film is deposited by the CVD method. At this time, the thickness of the W film is set smaller than the radius of each contact hole C1. Next, the Ti film, TiN film and W film are etched back or subjected to CMP until the surface of the silicon oxide film 21 is exposed, thereby removing the Ti film, TiN film and W film lying outside the contact holes C1 and wiring trenches HM. As a result, plugs P1 embedded in the contact holes C1, and wirings MD1 and MD2 each having a concave portion a thereabove are formed.

Figure 26:
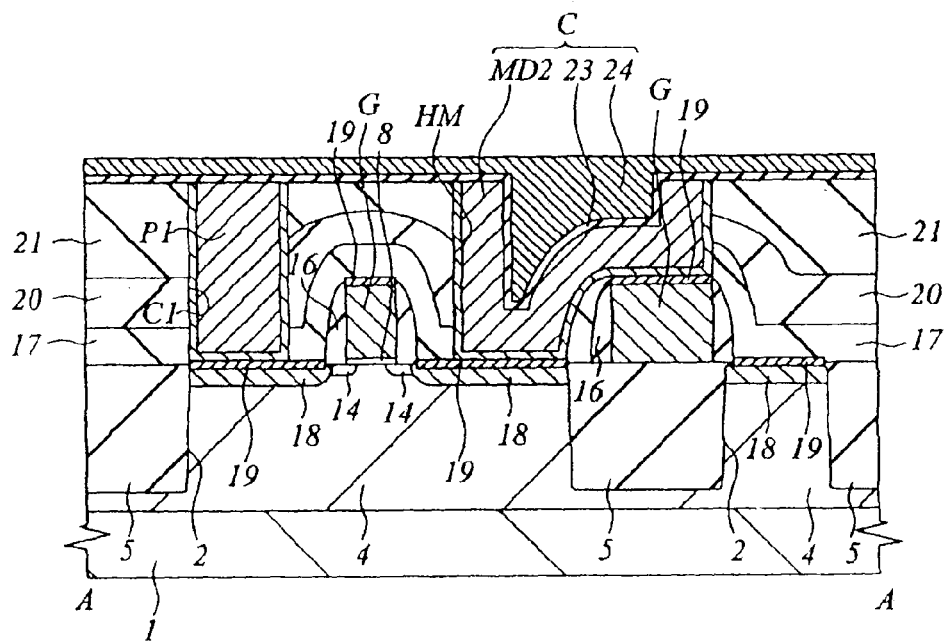
FIG. 26 is a fragmentary cross-sectional view of the substrate showing the method of manufacturing the SRAM illustrating the fourth embodiment of the present invention.

Next, as shown in FIG. 26, a silicon nitride film 23 is formed on the silicon oxide film 21, plugs P1 and wiring MD2. The silicon nitride film 23 is formed between the wirings MD1 and MD2 used as lower electrodes and an upper electrode 24 to be described later and results in a capacitive insulating film.

Next, a TiN film is deposited on the silicon nitride film 23 by the sputtering method and subjected to patterning to thereby form the upper electrode 24 which extends over the wirings MD1 and MD2 and over the plugs P1 on the sources of the load MISFETs Qp1 and Qp2 (similar to FIG. 22). The upper electrode 24 is patterned so as not to extend over the plugs P1 placed on one ends (the sides connected to data lines) of the transfer MISFETs Qt1 and Qt2 and over the plugs P1 on the sources of the driver MISFETs Qd1 and Qd2.

A capacitor or capacitance C, which comprises the wirings MD1 and MD2 used as the lower electrodes, silicon nitride film 23 and upper electrode 24, can be formed in accordance with the above-described process steps.

According to the present embodiment as described above, since the capacitance C connected to the wirings MD1 and MD2 is formed, a soft error produced due to an α ray launched into each memory cell of the SRAM can be reduced. Since the wirings MD1 and MD2 are formed using the W film having the thickness smaller than the radius of each contact hole C1, the concave portions a are formed over the wirings MD1 and MD2. Further, since the silicon nitride film 23 used as the capacitive insulating film can be formed along the concave portions a, the capacitance can be increased.

Next, a silicon oxide film 25 is deposited on the upper electrode 24 by the CVD method, followed by formation of first and second layer wirings M1 and M2. However, since process steps for forming these are similar to those employed in the first embodiment described with reference to FIGS. 13 through 17, the description thereof will be omitted.

Incidentally, in the present embodiment, the silicon nitride film 23 may be formed after the surface of the silicon oxide film 21 is etched subsequent to the formation of the plugs P1 and the wirings MD1 and MD2 as in the first embodiment. Since, in this case, the silicon nitride film 23 is formed along the sidewalls of the wirings MD1 and MD2, which have been exposed by the etching, the capacitance can further be increased.

In order to increase the capacitance, the silicon nitride film 23 may be formed after the formation of the lower electrodes 22 on the wirings MD1 and MD2 as in the second embodiment subsequent to the formation of the wirings MD1 and MD2. The plugs P1 and the wirings MD1 and MD2 are formed and thereafter the silicon nitride film 23 may be formed after the surface of the silicon oxide film 21 has been etched to form the lower electrodes 22 as in the third embodiment.

Fifth Embodiment

In the first embodiment (the second through fourth embodiments are similar), the upper electrode 24 is supplied with the source potential (Vcc) through the sidewalls of the plugs P2 (connected to the sources of the load MISFETs Qp1 and Qp2). However, the power supply voltage (Vcc) may be supplied thereto through the bottom face of each plug P2.

A method of manufacturing a SRAM according to the present embodiment will be explained with reference to FIGS. 27 through 32. Incidentally, since process steps up to the etching of the surface of the silicon oxide film 21, which have been described using FIGS. 2 through 10, are similar to those employed in the first embodiment, the description thereof will be omitted.

Figure 27:
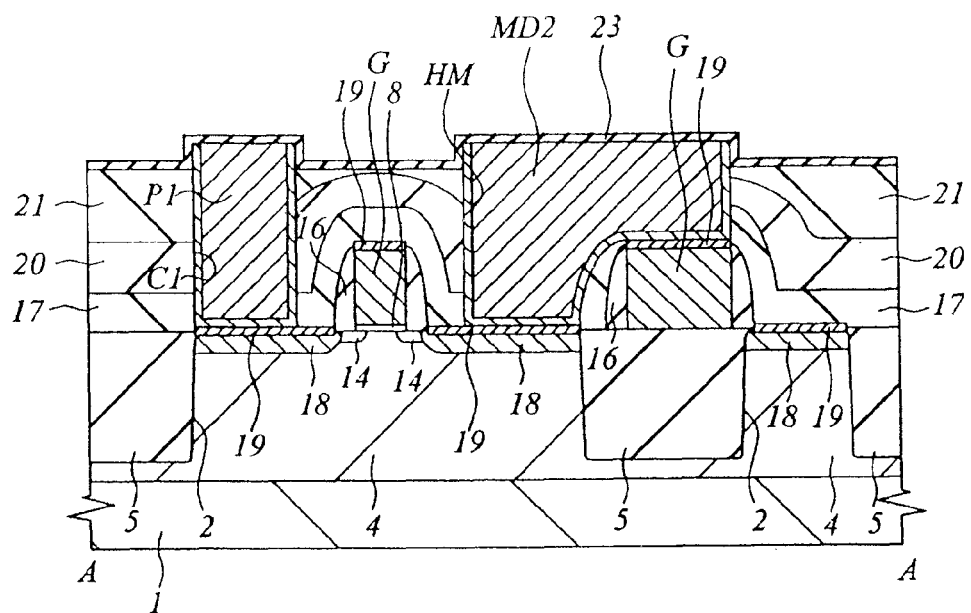
FIG. 27 is a fragmentary cross-sectional view of a substrate showing a method of manufacturing a SRAM illustrating a fifth embodiment of the present invention.

The semiconductor substrate 1 shown in FIG. 10 described in the first embodiment is first prepared. As shown in FIG. 27, a silicon nitride film 23 is formed on the silicon oxide film 21, plugs P1 and wiring MD2. The silicon nitride film 23 is formed between the wirings MD1 and MD2 used as the lower electrodes and an upper electrode 24 to be described later and serves as a capacitive insulating film.

Figure 28:
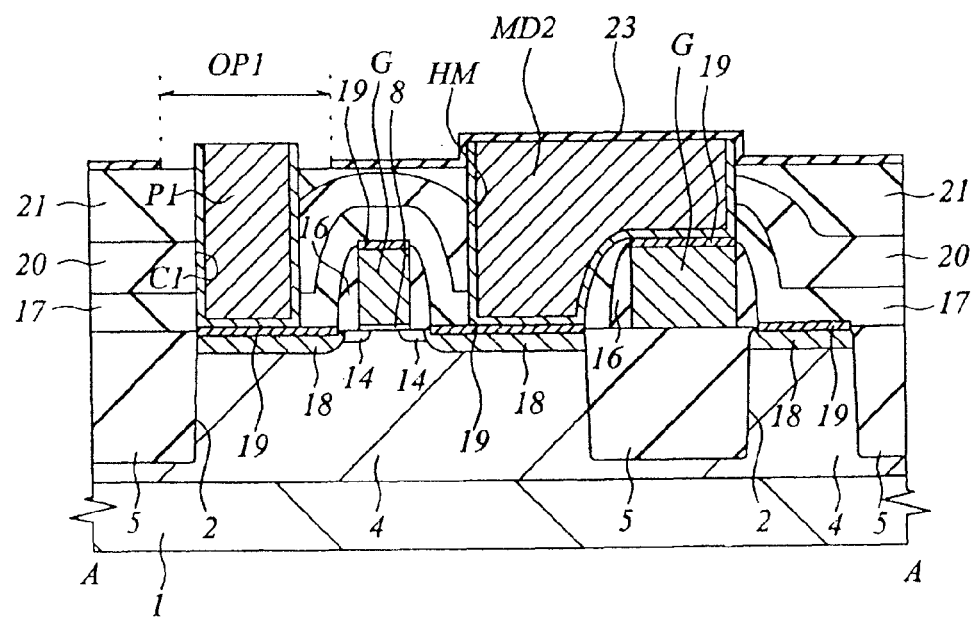
FIG. 28 is a fragmentary cross-sectional view of the substrate showing the method of manufacturing the SRAM illustrating the fifth embodiment of the present invention.
Figure 29:
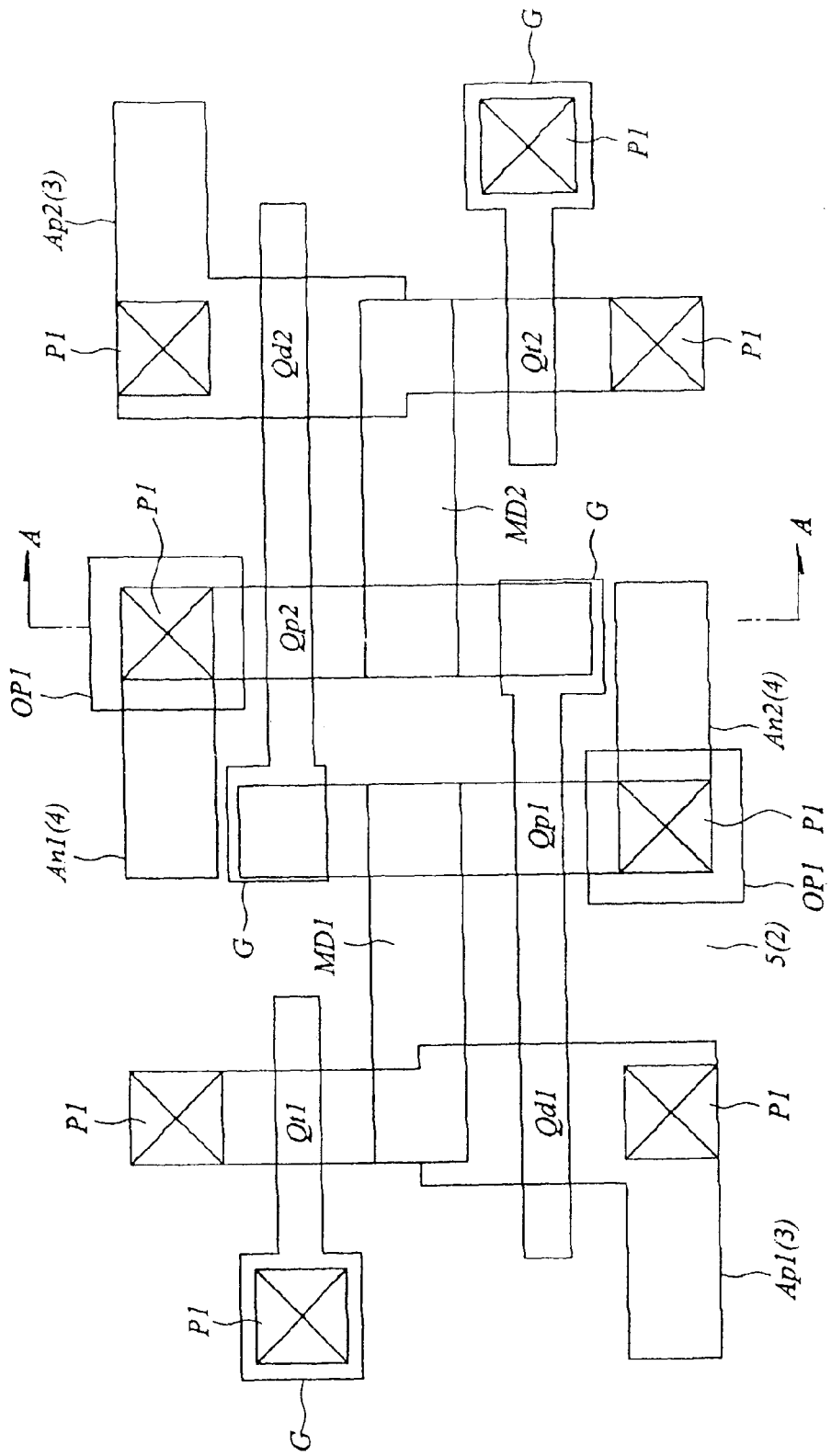
FIG. 29 is a fragmentary plan view of the substrate showing the method of manufacturing the SRAM illustrative of the fifth embodiment of the present invention.

Next, as shown in FIGS. 28 and 29, the silicon nitride film 23 on the plugs P1 on the sources of the load MISFETs is removed to define openings OP1.

Figure 30:
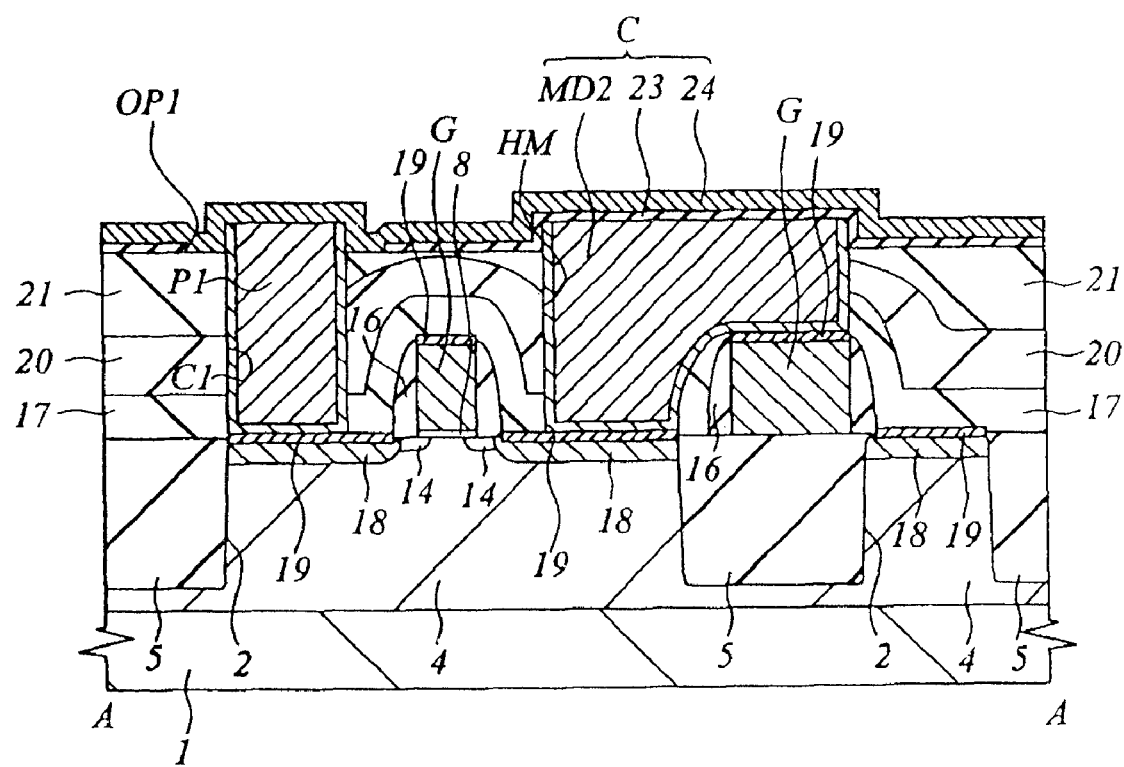
FIG. 30 is a fragmentary cross-sectional view of the substrate showing the method of manufacturing the SRAM illustrating the fifth embodiment of the present invention.
Figure 31:
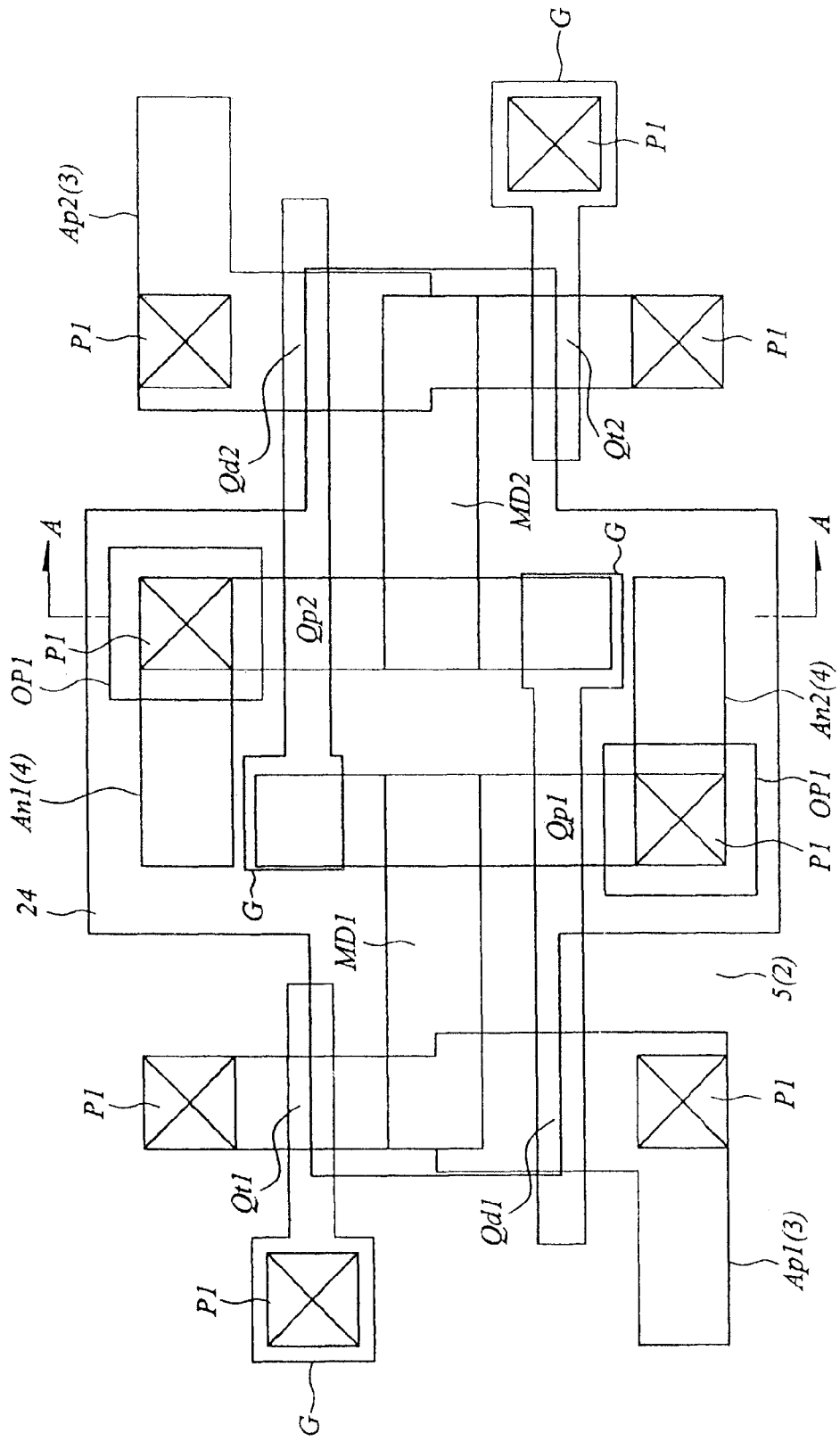
FIG. 31 is a fragmentary plan view of the substrate showing the method of manufacturing the SRAM illustrating the fifth embodiment of the present invention.

Next, as shown in FIGS. 30 and 31, a TiN film is deposited on the silicon nitride film 23 including the interiors of the openings OP1 by a sputtering method and subjected to patterning to form the upper electrode 24 which extends on the wirings MD1 and MD2 and over the plugs P1 on the sources of the load MISFETs Qp1 and Qp2. The upper electrode 24 is patterned so as not to extend on the plugs P1 placed on one ends (the sides connected to data lines) of the transfer MISFETs Qt1 and Qt2, and the plugs P1 on the sources of the driver MISFETs Qd1 and Qd2.

A capacitor or capacitance C, which comprises the wirings MD1 and MD2 used as the lower electrodes, silicon nitride film 23 and upper electrode 24, can be formed according to the above-described process steps.

Figure 32:
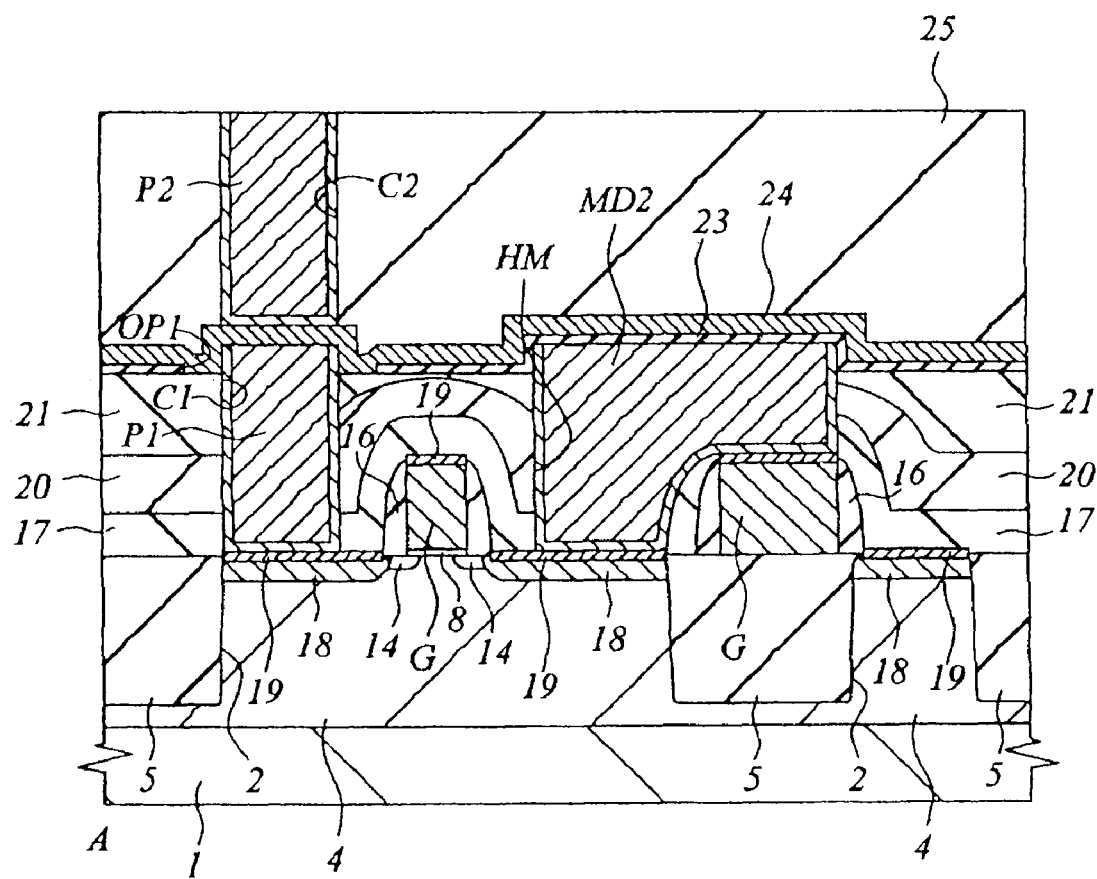
FIG. 32 is a fragmentary cross-sectional view of the substrate showing the method of manufacturing the SRAM illustrative of the fifth embodiment of the present invention.

Next, as shown in FIG. 32, a silicon oxide film 25 is deposited on the upper electrode 24 by a CVD method. Next, the silicon oxide film 25 placed over the plugs P1 is removed by etching to thereby define contact holes C2.

Thus since the silicon nitride film 23 placed on the plugs P1 on the sources of the load MISFETs Qp1 and Qp2 is removed in advance in the present embodiment, only the silicon oxide film 25 above the plugs P1 may be removed, and hence the contact holes C2 placed on the plugs P1 can be formed easily.

Even if an alignment displacement occurs between each plug P1 and the contact hole C2, the plugs P1 and the plugs P2 formed within the contact holes C2 are connected with the upper electrode 24 interposed therebetween. It is therefore possible to lessen a failure in conduction or continuity between the plugs P1 and P2. A margin for a short between each of the gate electrodes G and its corresponding plug P2 can be ensured.

Next, first and second layer wirings M1 and M2 are formed on the silicon oxide film 25. Since, however, process steps for forming these wirings are similar to those employed in the first embodiment described while referring to FIGS. 15 through 17, the description thereof will be omitted.

Incidentally, the second through fourth embodiments can also bring about the aforementioned effects in a manner similar to the above if the silicon nitride film 23 placed on the plugs P1 on the sources of the load MISFETs Qp1 and Qp2 is removed to form the openings OP1 and thereafter the upper electrode 24 and plugs P2 are formed.

Sixth Embodiment

While the first embodiment (the second through fourth embodiment are also similar) has described the region for substantially one memory cell, a description will be made of the case in which the present invention is applied to a memory cell array.

Figure 33:
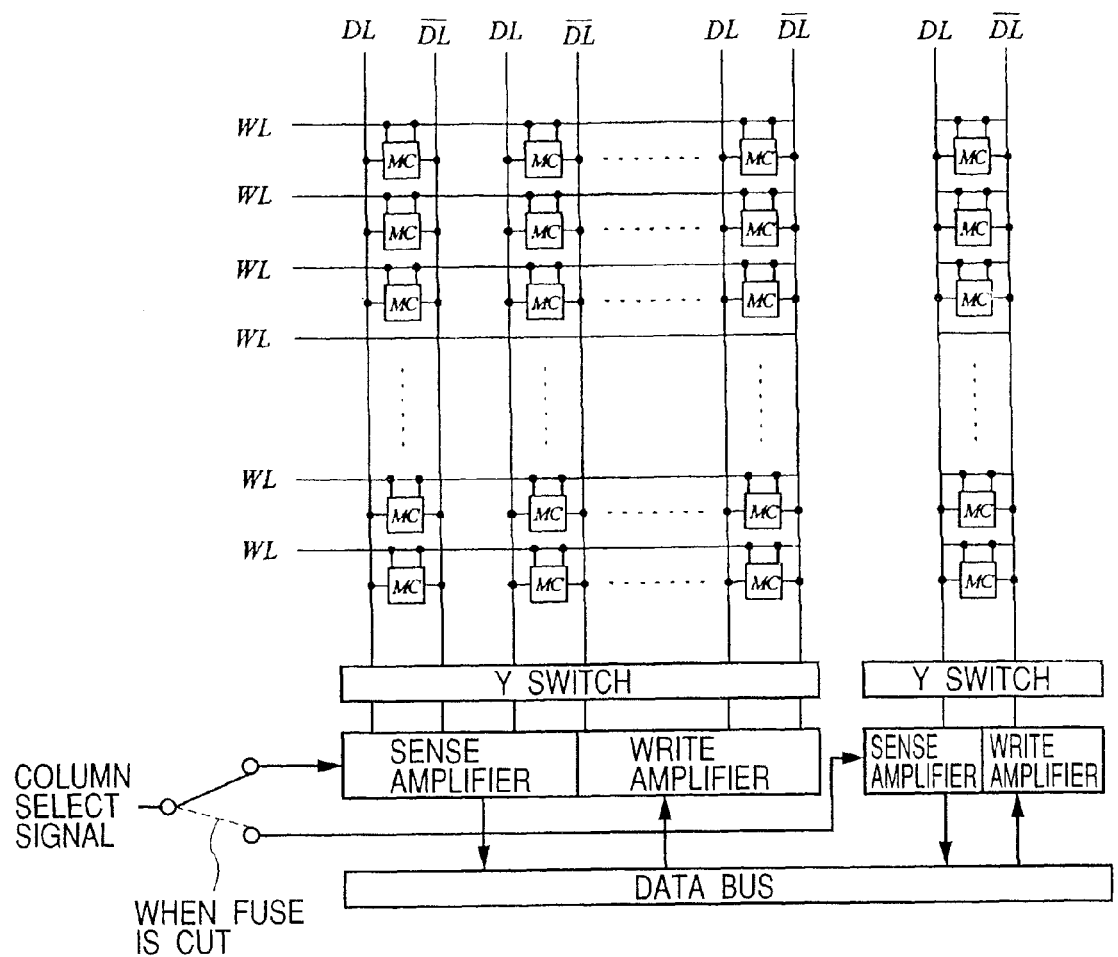
FIG. 33 is a view illustrating the layout of memory cells of a SRAM showing a sixth embodiment of the present invention.
Figure 34:
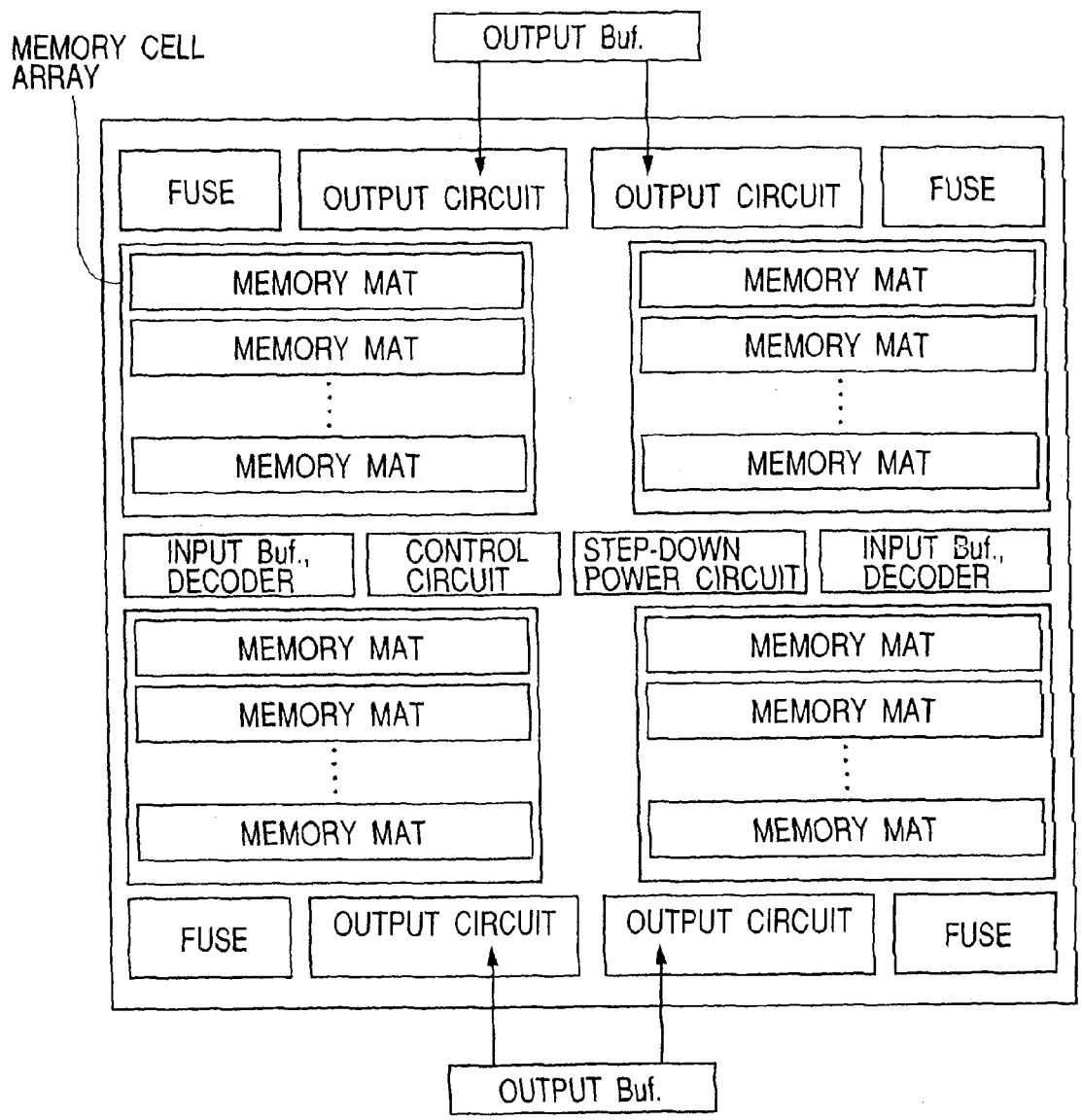
FIG. 34 is a view depicting the layout of memory cell arrays of the SRAM showing the sixth embodiment of the present invention.

As shown in FIG. 33, memory cells MCs are respectively placed in matrix form at points where data line pairs (DL and /DL) and word lines WL intersect respectively. Redundancy relief memory cells are formed in a memory cell array in addition to the normal memory cells. The redundancy relief memory cells are also placed at points where the data line pairs (DL and /DL) and the word lines WL intersect respectively. When a defect occurs in one of the normal memory cells, a sequence or column of memory cells connected to the same data lines (DL and /DL) as that is replaced with a redundancy relief memory cell column by cutting out a fuse (FUSE). FIG. 34 shows the layout of memory cell arrays placed on a chip. As shown in FIG. 34, each of the memory cell arrays comprises a plurality of memory mats. Peripheral circuits such as input buffers (input Buf.), output circuits and FUSEs, etc. are placed around the memory cell arrays respectively. Incidentally, it is not necessary to form the aforementioned redundancy relief memory cell columns in all the memory mats.

Figure 35:
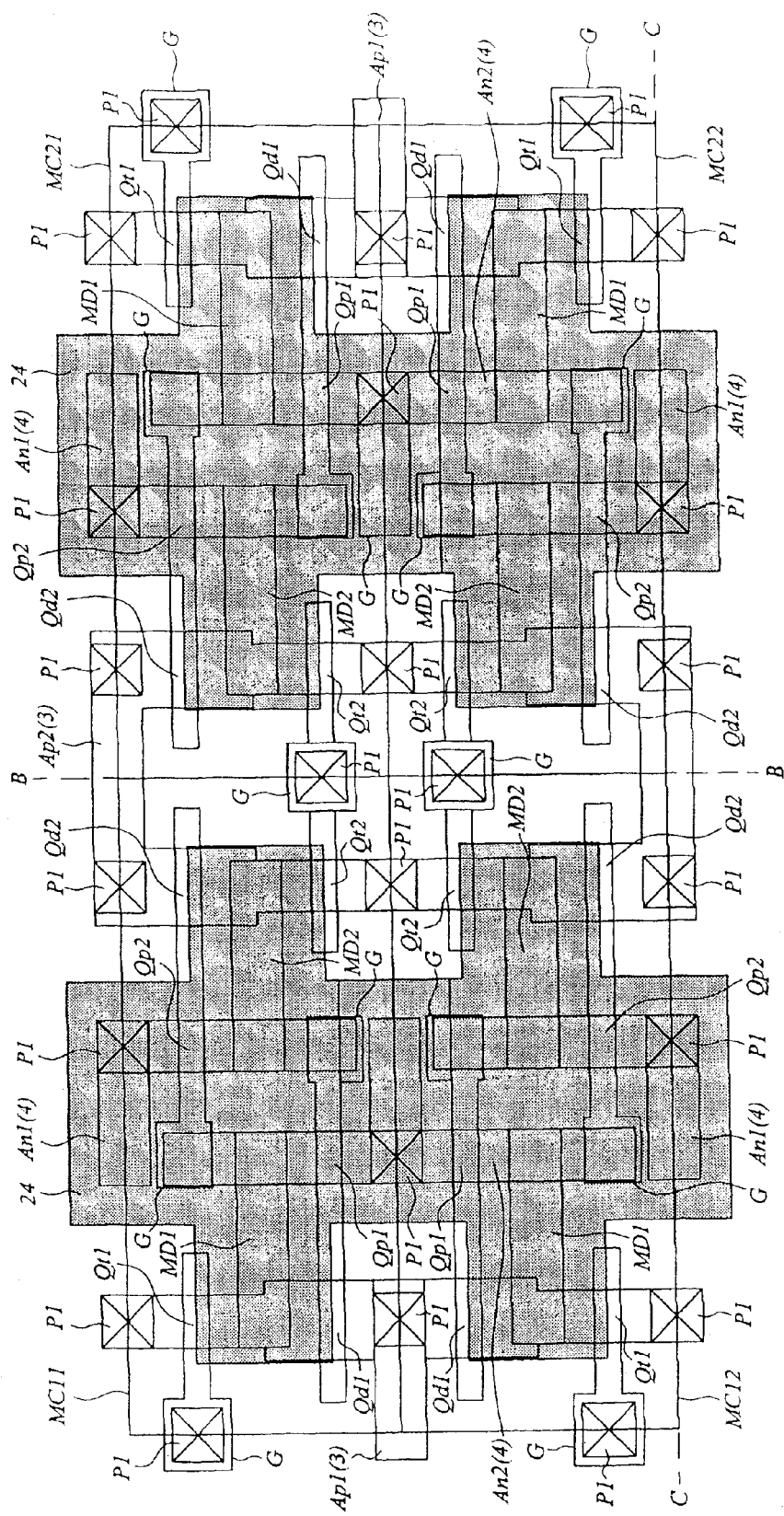
FIG. 35 is a fragmentary plan view of a substrate showing a method of manufacturing the SRAM illustrating the sixth embodiment of the present invention.

FIG. 35 is a fragmentary plan view of a semiconductor substrate showing a SRAM according to the present embodiment. Memory cells MC11, MC12, MC21 and MC22 in twos as viewed vertically and horizontally are placed in the drawing. Since the memory cells MC11 and MC12 are identical in configuration to the memory cell employed in the first embodiment described using FIGS. 2 through 17, the description thereof will be omitted. Further, the memory cells MC21 and MC22 respectively have structures symmetrical about line B-B in the drawing with respect to the memory cells MC11 and MC12. Although not shown in the drawing, memory cells symmetric about line C-C in the drawing with respect to the memory cells MC11 and MC12 are arranged. Further, memory cells symmetrical about line C-C in the drawing with respect to the memory cells MC21 and MC22 are placed.

Here, an upper electrode 24 for the memory cells MC11 and MC12 is connected. Further, an upper electrode 24 for the memory cells MC21 and MC22 is also connected. The upper electrode 24 for the memory cells (MC11 and MC12) connected to one data line pair (DL and /DL) and the upper electrode 24 for the memory cells (MC21 and MC22) connected to another data line pair (DL and /DL) are independent of each other (disconnected from each other).

Thus if the upper electrodes 24 are divided every data line pairs (DL and /DL), then redundancy relief every memory cells columns connected to the same data line pair (DL and /DL) can be easily carried out.

Incidentally, if the upper electrodes 24 are divided every data line pairs (DL and /DL) in the same manner even in the case of the second through fourth embodiments, then redundancy relief every memory cell columns each connected to the same data line pair (DL and /DL) can be performed with ease.

When redundancy relief is carried out every memory cell rows each connected to the same word line pair (WL), the upper electrodes 24 may be divided every word lines (WL). On the other hand, when redundancy relief is performed every memory cells (for each bit), the upper electrodes 24 may be divided every memory cells.

Seventh Embodiment

While the upper electrode 24 is supplied with the source potential (Vcc) and the capacitance C is formed between the storage node A or B and the source potential (Vcc) in FIG. 1 in the first embodiment (similar even to the second through fourth embodiments), the capacitance may be formed between the storage nodes A and B in FIG. 1.

A method of manufacturing a SRAM according to the present embodiment will be explained using FIGS. 36 through 46. Incidentally, since process steps up to the etching of the surface of the silicon oxide film 21, which have been described using FIGS. 2 through 10, are similar to those employed in the first embodiment, the description thereof will be omitted.

Figure 36:
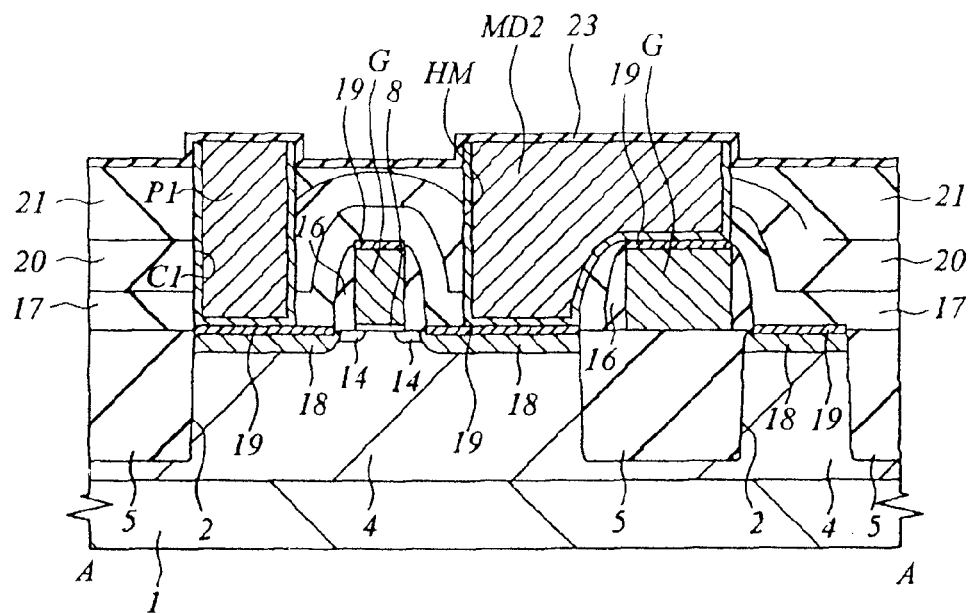
FIG. 36 is a fragmentary cross-sectional view of a substrate showing a method of manufacturing a SRAM illustrating a seventh embodiment of the present invention.
Figure 37:
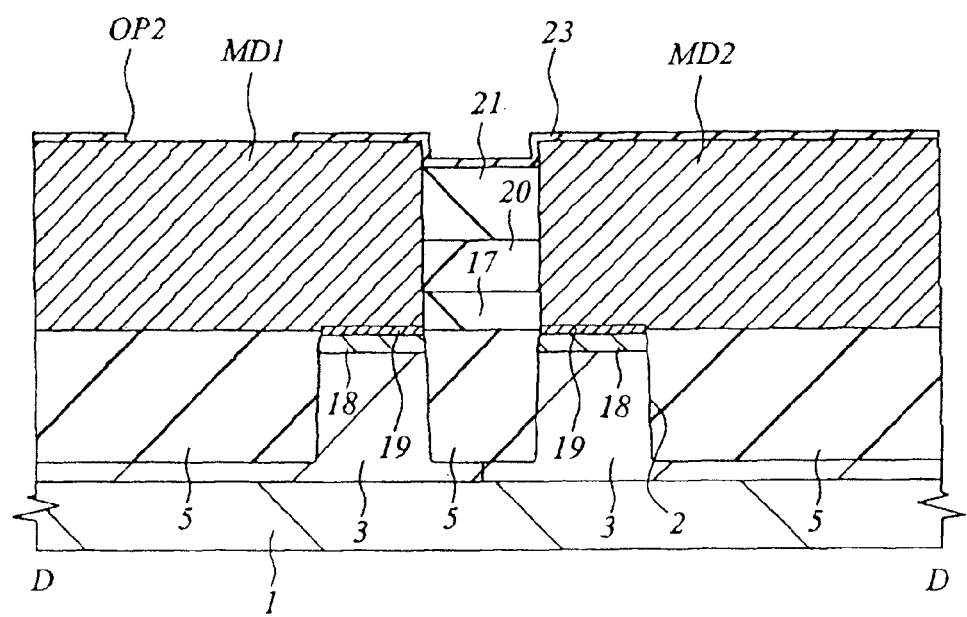
FIG. 37 is a fragmentary cross-sectional view of the substrate showing the method of manufacturing the SRAM illustrating the seventh embodiment of the present invention.
Figure 38:
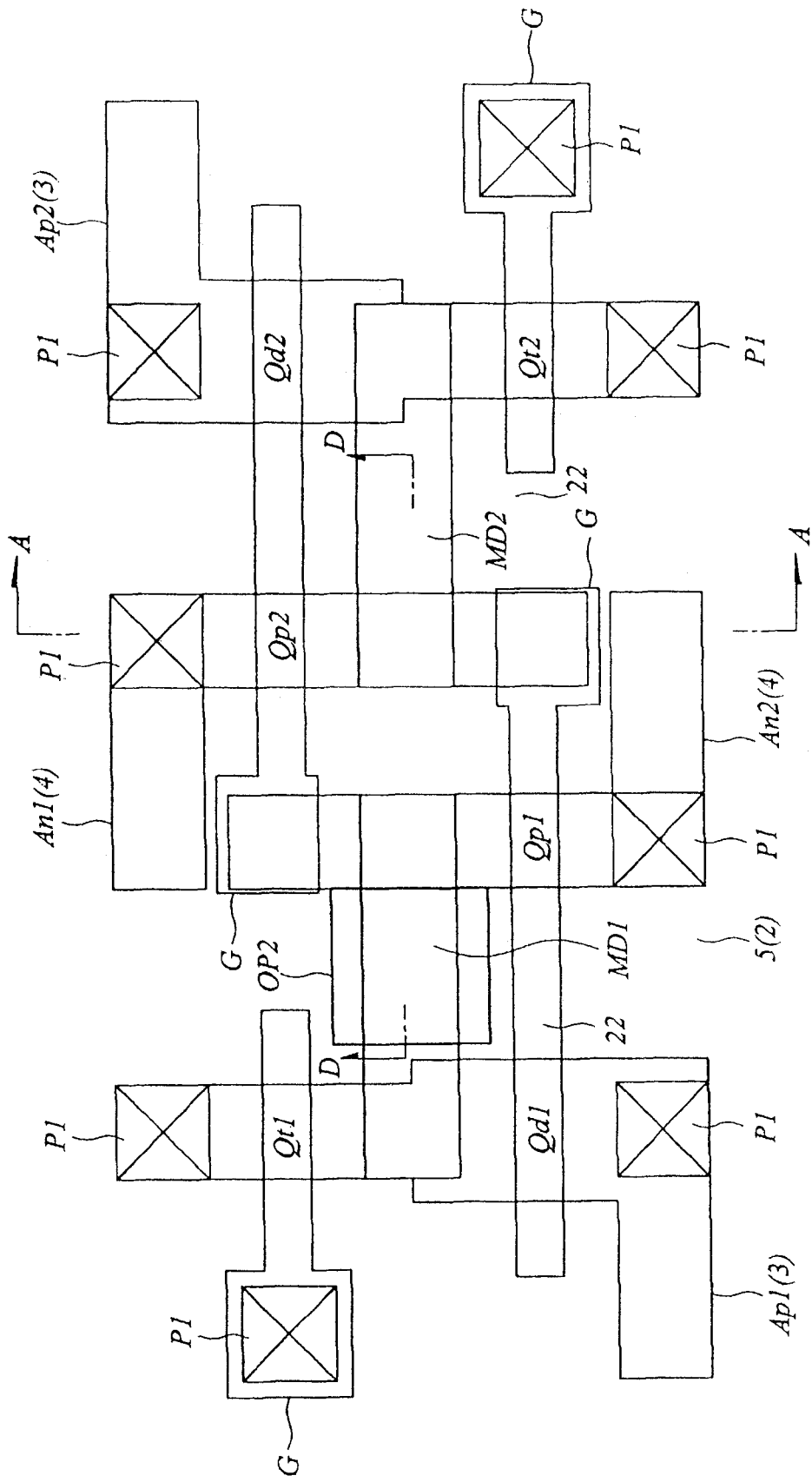
FIG. 38 is a fragmentary plan view of the substrate showing the method of manufacturing the SRAM illustrating the seventh embodiment of the present invention.

The semiconductor substrate 1 shown in FIG. 10, which has been described in the first embodiment, is first prepared. As shown in FIGS. 36, 37 and 38, a silicon nitride film 23 is formed on the silicon oxide film 21, plugs P1 and wirings MD1 and MD2. The silicon nitride film 23 is formed between the wirings MD1 and MD2 used as the lower electrodes and an upper electrode 24 to be described later and serves as a capacitive insulating film. FIG. 38 is a fragmentary plan view of a substrate showing the method of manufacturing the SRAM according to the present embodiment. FIGS. 36 and 37 respectively correspond to a cross-section taken along line A-A in FIG. 38 and a cross-section taken along line D-D in FIG. 38.

Next, the silicon nitride film 23 on the wiring MD1 is removed to define an opening OP2.

Figure 39:
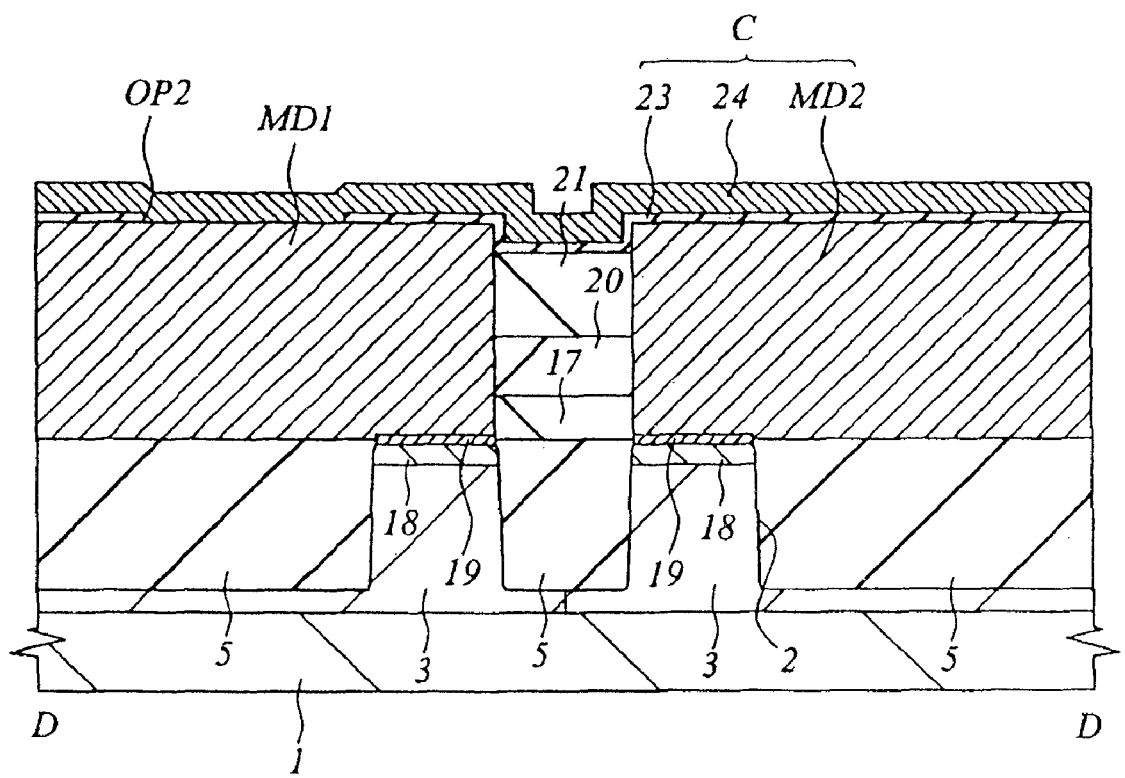
FIG. 39 is a fragmentary cross-sectional view of the substrate showing the method of manufacturing the SRAM illustrating the seventh embodiment of the present invention.
Figure 40:
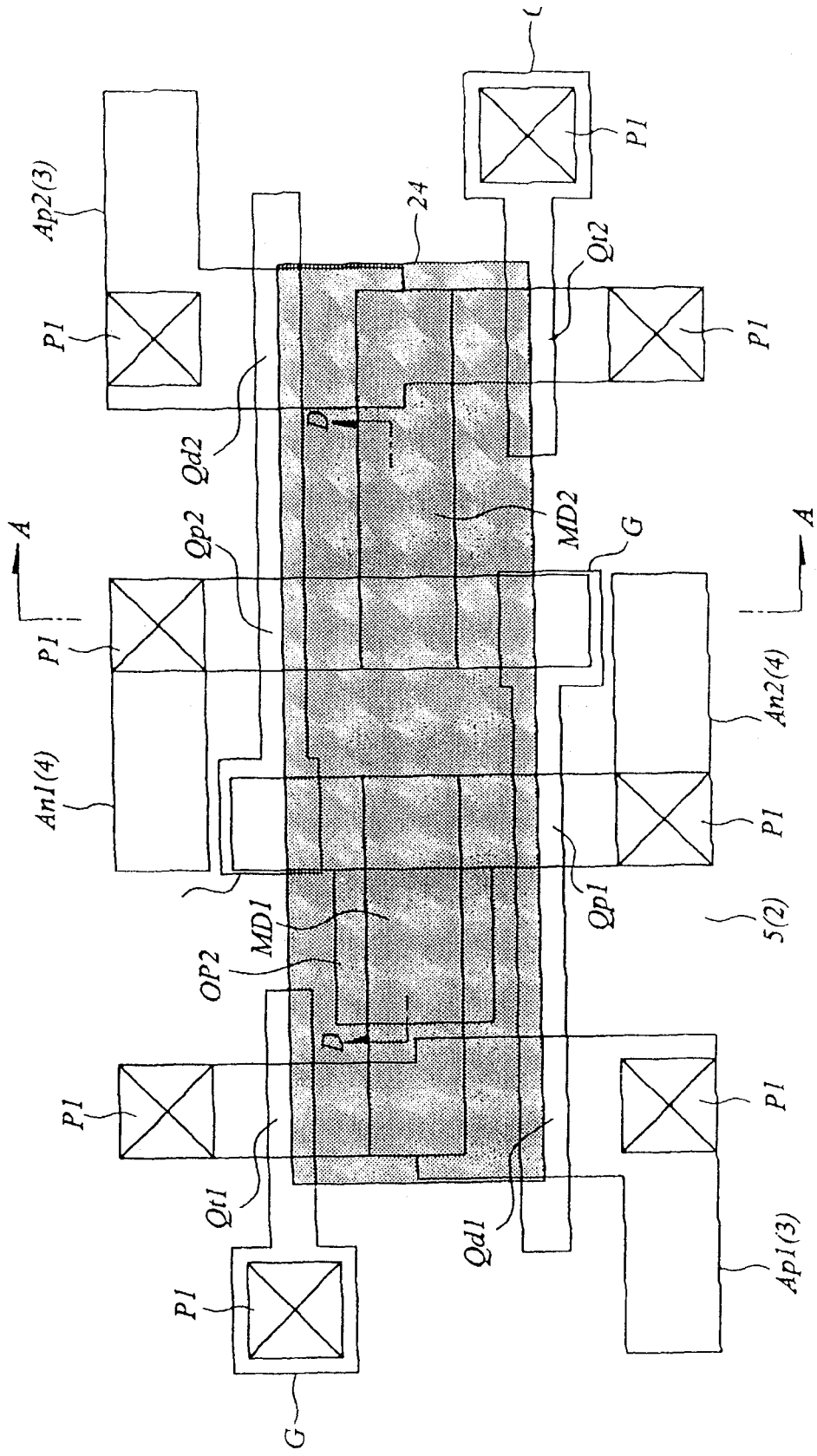
FIG. 40 is a fragmentary plan view of the substrate showing the method of manufacturing the SRAM illustrating the seventh embodiment of the present invention.

As shown in FIGS. 39 and 40, a TiN film is deposited on the silicon nitride film 23 including the interior of the opening OP2 by a sputtering method and subjected to patterning to thereby form the upper electrode 24 which extends over the wirings MD1 and MD2. The upper electrode 24 is connected to the wiring MD1 through the opening OP2.

A capacitor or capacitance C, which comprises the wiring MD2 used as the lower electrode, silicon nitride film 23 and upper electrode 24 connected to the wiring MD1, can be formed according to the above-described process steps. The capacitance C serves as a capacitor or capacitance connected between the storage nodes A and B in FIG. 1.

Thus according to the present embodiment, since the capacitance C is formed of the wiring MD2 used as the lower electrode, the silicon nitride film 23 and the upper electrode 24 connected to the wiring MD1, a soft error produced due to an α ray launched into each memory cell of the SRAM can be reduced. When the capacitance is formed between the storage nodes A and B in FIG. 1, a critical amount of charge (C) increases as in the present embodiment as compared with the case in which the capacitance C is formed between the storage node A or B and the power supply voltage (Vcc) in FIG. 1.

Figure 47:
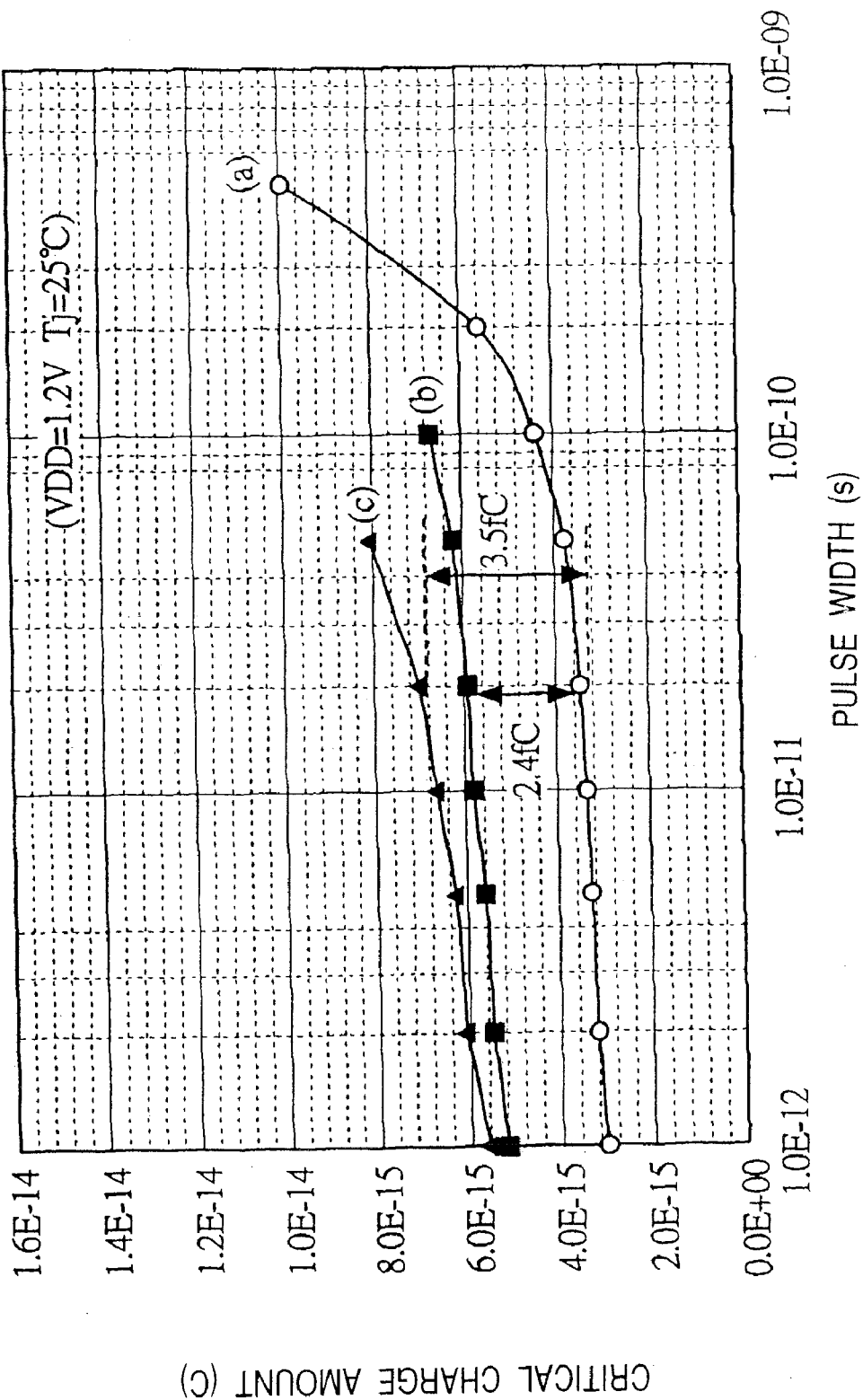
FIG. 47 is a view for describing the effects of the present invention.
Figure 48:
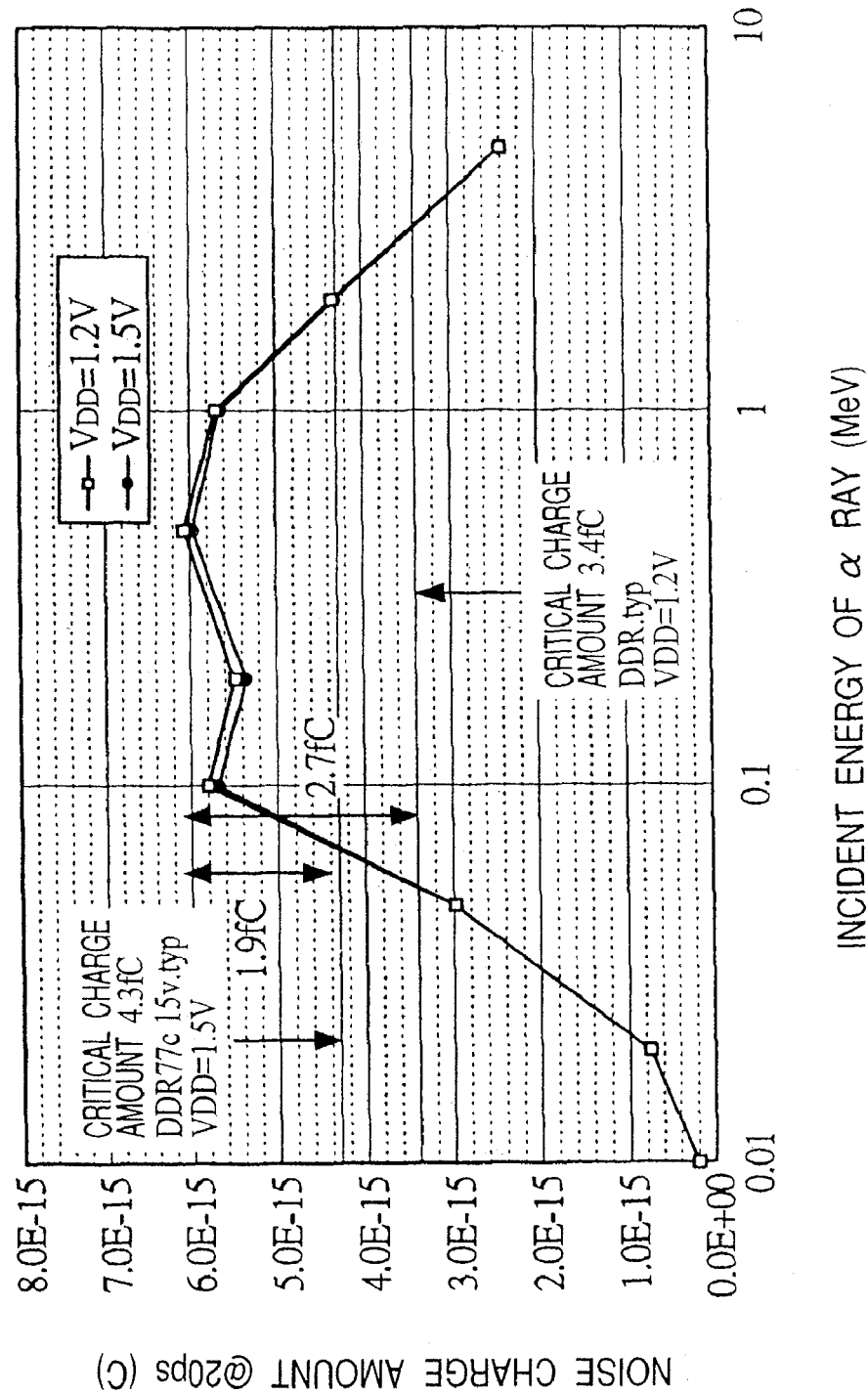
FIG. 48 is a view for describing a problem to be solved by the present invention.

FIG. 47 shows a result obtained by simulating critical amounts of charges at which data held at the storage node is inverted, where a noise (current) pulse is applied to the storage node (A or B). The horizontal axis of a graph indicates a pulse width (s), and the vertical axis thereof indicates a critical amount of charge (C). When no capacitor or capacitance C is formed (a), the critical charge amount increases as shown in FIG. 47 in both cases: (c) where a capacitance (2 fF) is formed between the storage nodes A and B and (b) where the capacitance (2 fF) is formed between the storage node A(B) and the source potential (Vcc). However, the formation of the capacitance between the storage nodes A and B (c) rather than the formation of the capacitance between the storage node A(B) and the source potential (Vcc) is large in critical charge amount. When the pulse width is 20 nm, for example, the capacitance in the case of (b) is increased by 2.4 fC as compared with the case of (a), whereas the capacitance in the case of (c) is increased by 3.5 fC as compared with the case of (a), thus bringing about an effect of about 1.5 times.

Next, a silicon oxide film is deposited on the upper electrode 24 by a CVD method, followed by formation of first and second layer wirings M1 and M2. However, since these process steps are similar to those employed in the first embodiment described with reference to FIGS. 13 through 17, the description thereof will be omitted. Incidentally, since the upper electrode 24 does not extend to over the sources of the load MISFETs Qp1 and Qp2 as shown in FIG. 40, the plugs P1 and P2 on the sources of the load MISFETs Qp1 and Qp2, and the upper electrode 24 are not connected to one another.

In a manner similar to the above even in the case of the fourth embodiment (where no lower electrodes 22 are formed), the silicon nitride film 23 on the wiring MD1 is removed to define an opening OP2, and thereafter an upper electrode 24 is formed on the silicon nitride film 23 including the interior of the opening OP2, whereby a capacitance can be formed between the storage nodes A and B in FIG. 1.

A description will be made below of the second and third embodiments each having the lower electrodes 22.

Figure 41:
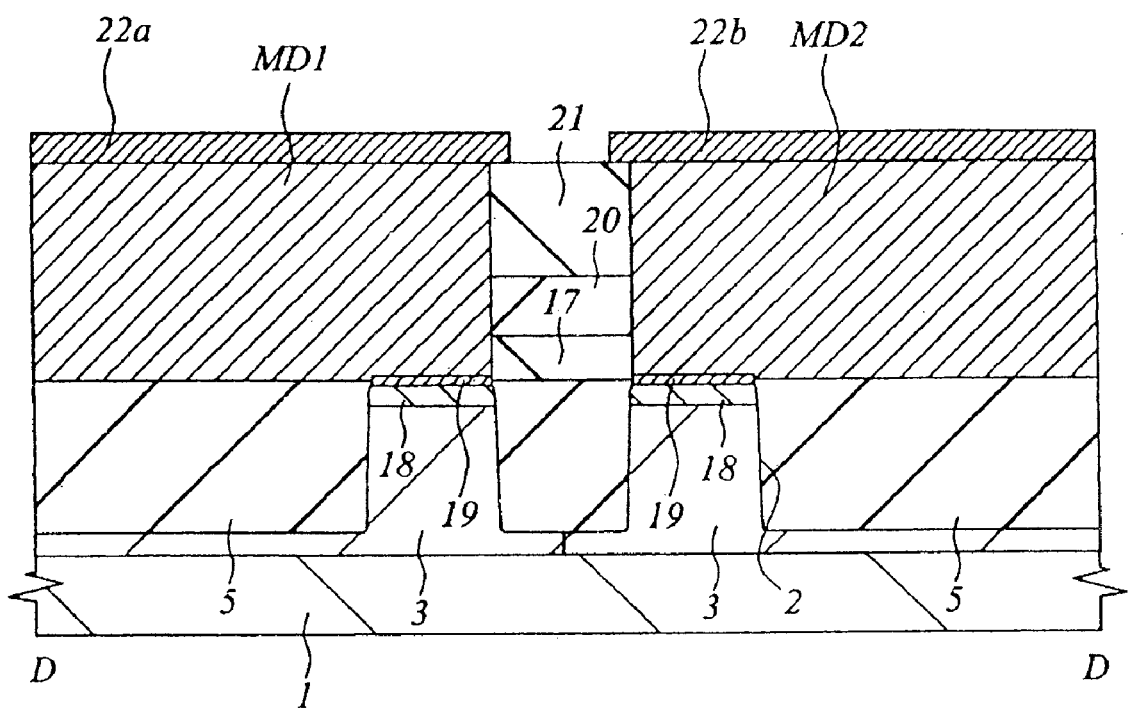
FIG. 41 is a fragmentary cross-sectional view of the substrate showing the method of manufacturing the SRAM illustrating the seventh embodiment of the present invention.
Figure 42:
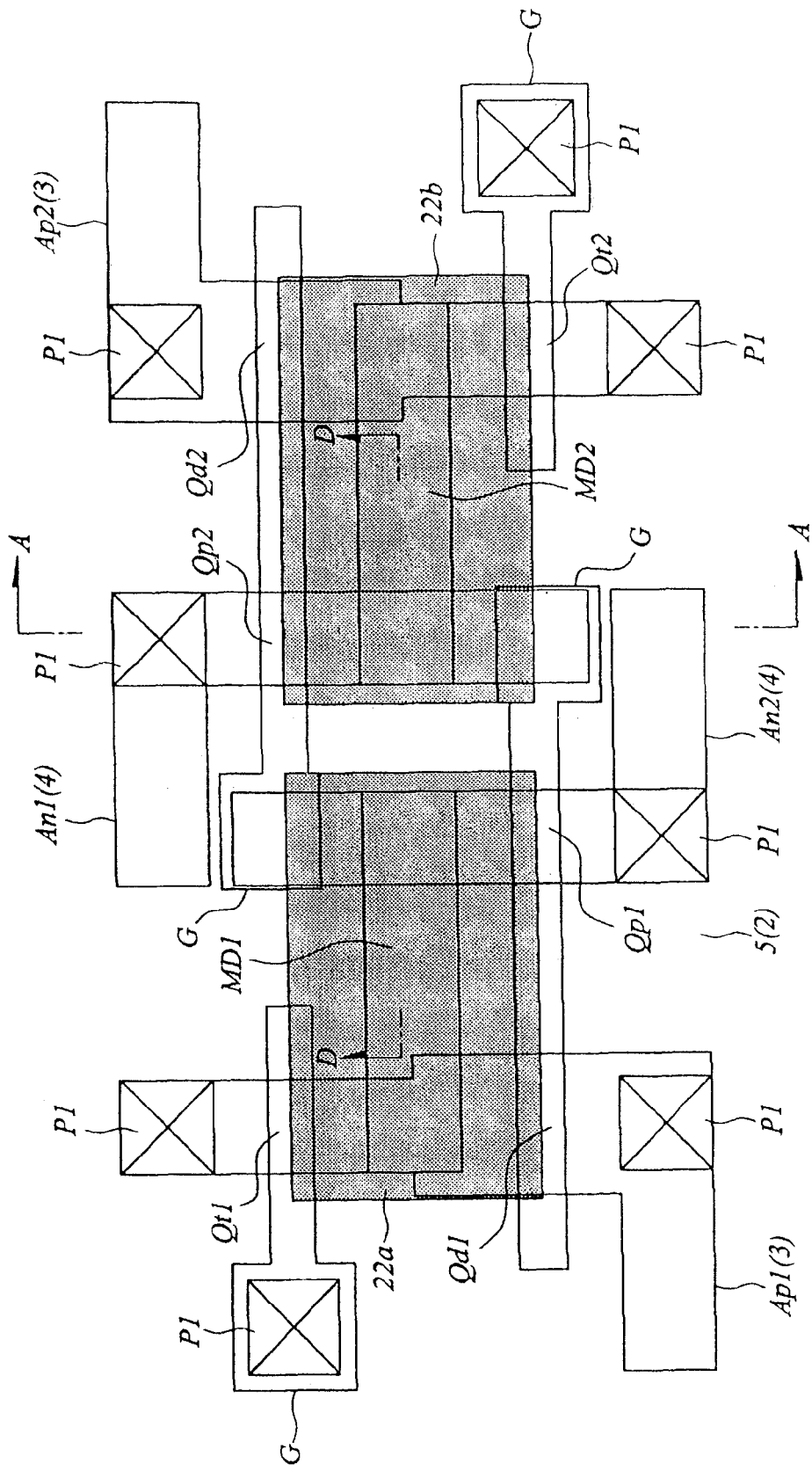
FIG. 42 is a fragmentary plan view of the substrate showing the method of manufacturing the SRAM illustrating the seventh embodiment of the present invention.

The semiconductor substrate 1 shown in FIG. 8, which has been described in the first embodiment, is first prepared. As shown in FIGS. 41 and 42, a TiN film is deposited on the silicon oxide film 21, plugs P1 and wirings MD1 and MD2 by the sputtering method and subjected to patterning to thereby form lower electrodes 22a and 22b on the wirings MD1 and MD2. Areas for forming the lower electrodes 22a and 22b are respectively larger than those for forming the wirings MD1 and MD2. FIG. 42 is a fragmentary plan view of the substrate showing the method of manufacturing the SRAM according to the present embodiment. FIG. 41 corresponds to a cross-section taken along line D-D in FIG. 42.

Next, a silicon nitride film 23 is formed on the lower electrodes 22a and 22b and the silicon oxide film 21. The silicon nitride film 23 is formed between the lower electrodes 22a and 22b and an upper electrode 24 to be described later and servers as a capacitive insulating film.

Figure 43:
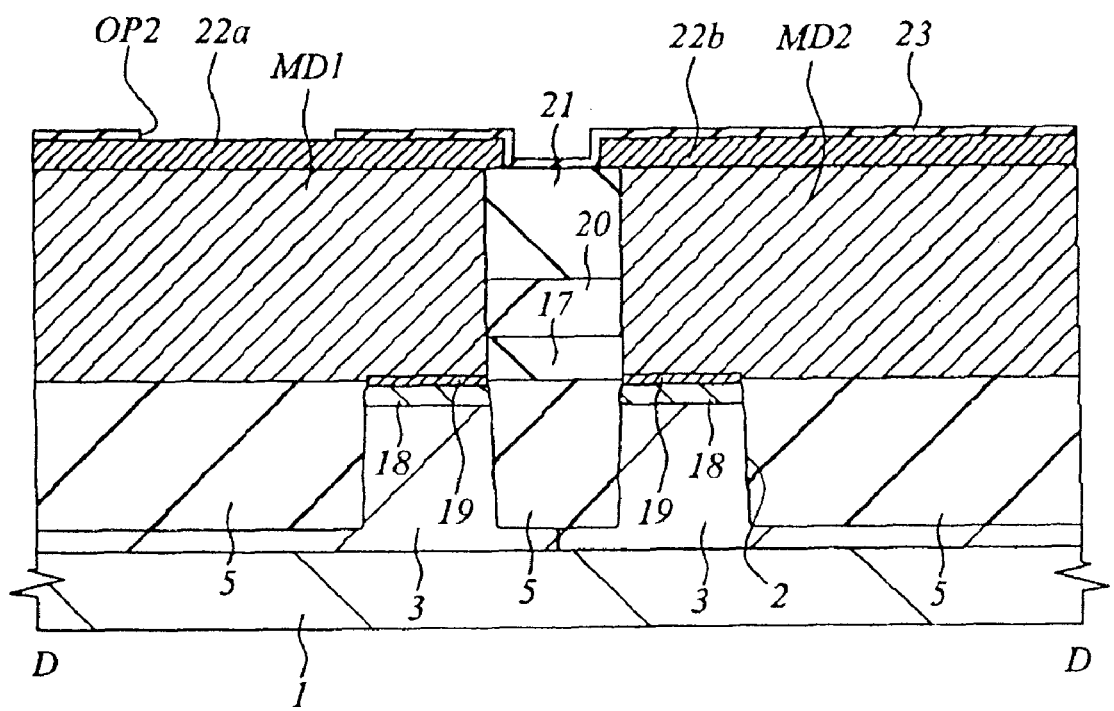
FIG. 43 is a fragmentary cross-sectional view of the substrate showing the method of manufacturing the SRAM illustrating the seventh embodiment of the present invention.
Figure 44:
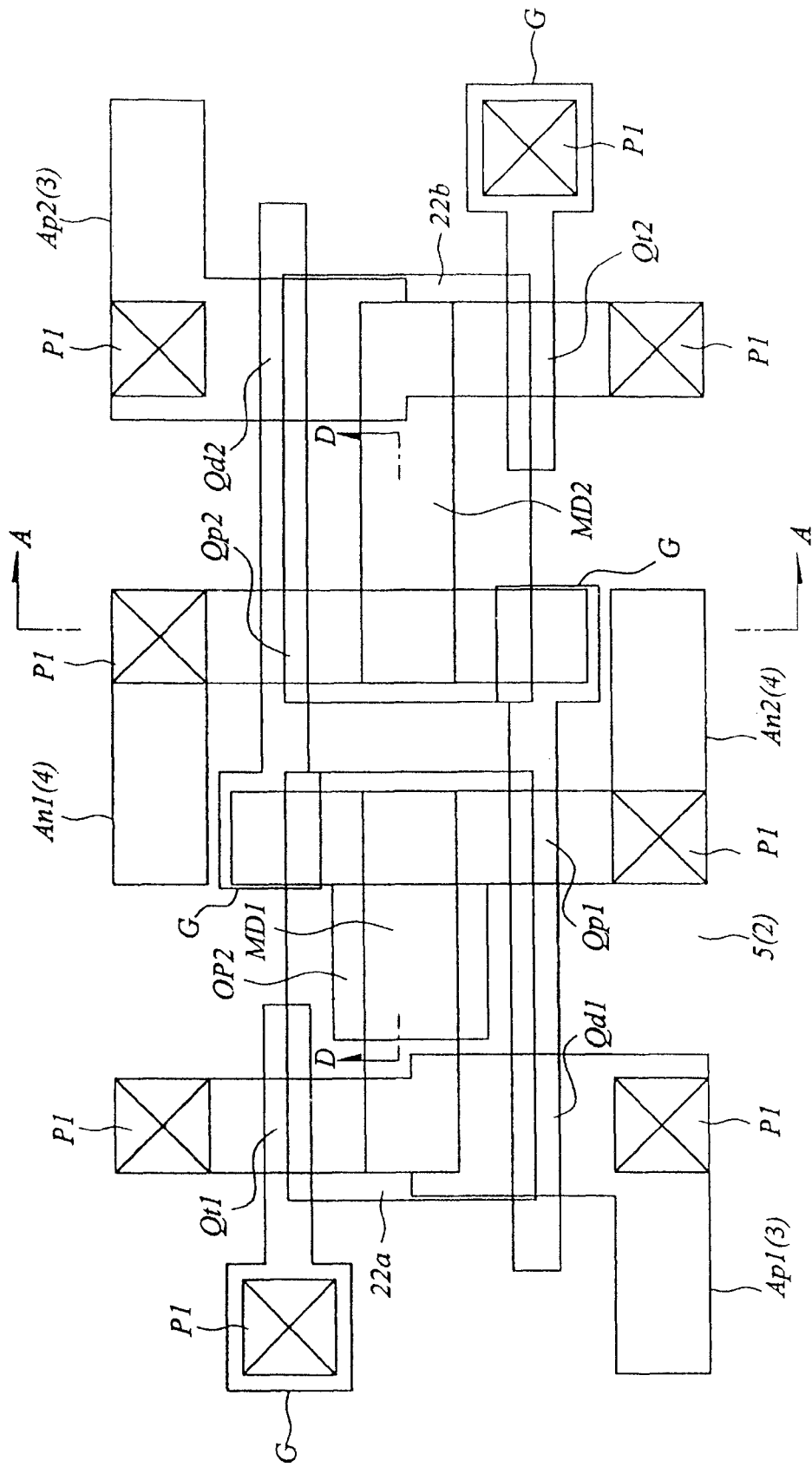
FIG. 44 is a fragmentary plan view of the substrate showing the method of manufacturing the SRAM illustrating the seventh embodiment of the present invention.

Next, as shown in FIGS. 43 and 44, the silicon nitride film 23 on the wiring MD1 is removed to define an opening OP2.

Figure 45:
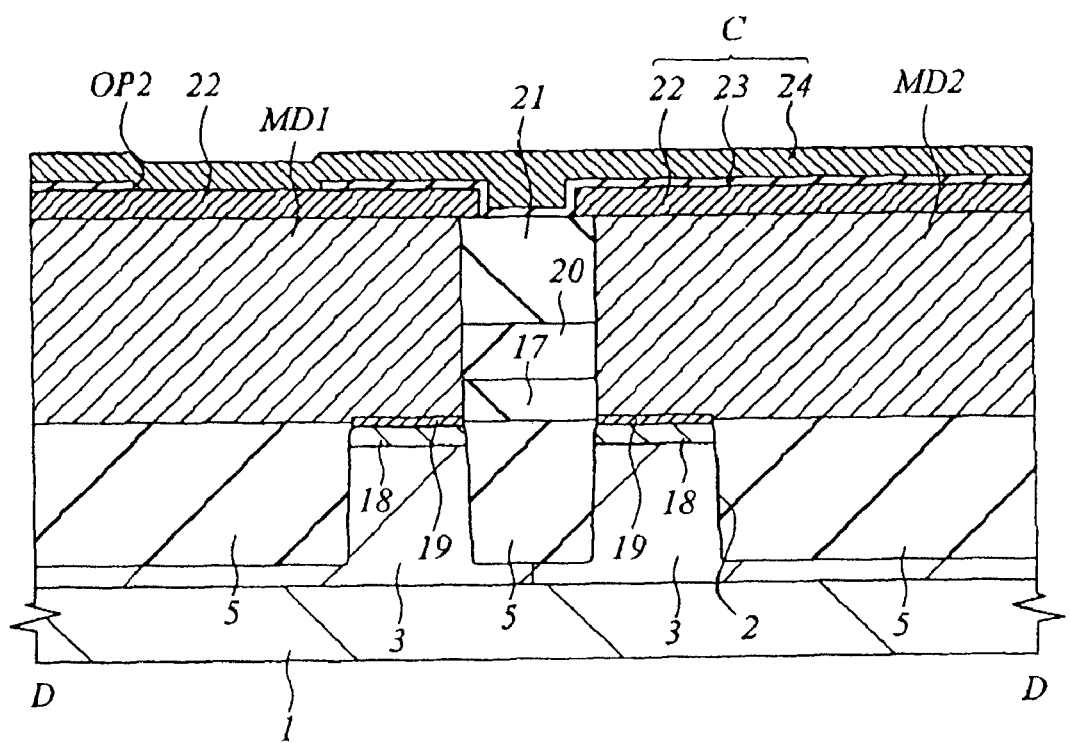
FIG. 45 is a fragmentary cross-sectional view of the substrate showing the method of manufacturing the SRAM illustrating the seventh embodiment of the present invention.
Figure 46:
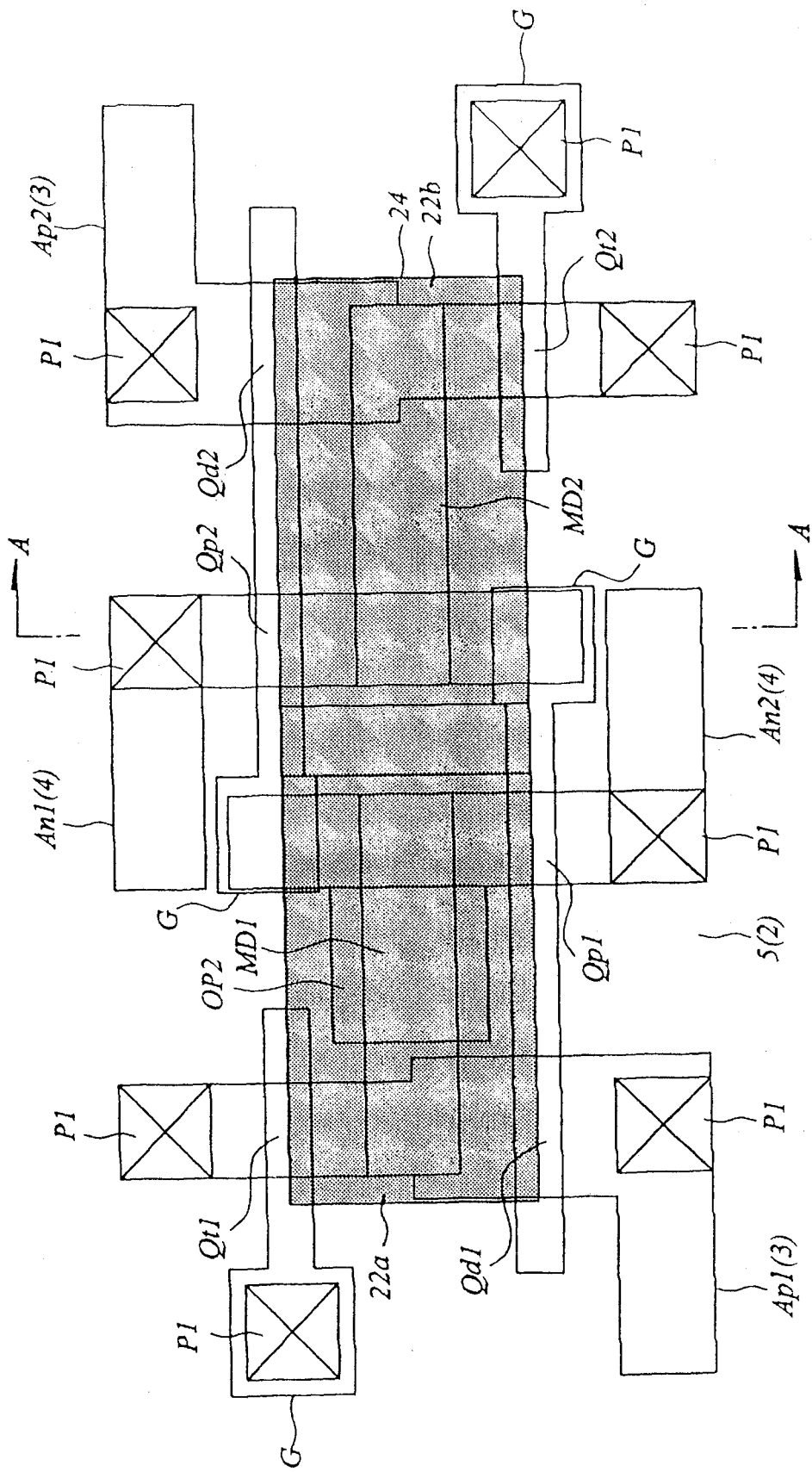
FIG. 46 is a fragmentary plan view of the substrate showing the method of manufacturing the SRAM illustrating the seventh embodiment of the present invention.

Next, as shown in FIGS. 45 and 46, a TiN film is deposited on the silicon nitride film 23 including the interior of the opening OP2 by the sputtering method and subjected to patterning to thereby form the upper electrode 24 which extends over the wirings MD1 and MD2. The upper electrode 24 is connected to the lower electrode 22a on the wiring MD1 through the opening OP2.

A capacitance C, which comprises the lower electrode 22b, silicon nitride film 23 and upper electrode 24 connected to the wiring MD1, can be formed according to the above-described process steps. The capacitance C results in a capacitance connected between the storage nodes A and B in FIG. 1.

In a manner similar to the above even in the case of the third embodiment, the silicon nitride film 23 on the lower electrode 22a of the lower electrodes 22a and 22b placed on the wirings MD1 and MD2 is removed to define an opening OP2, followed by formation of an upper electrode on the silicon nitride film 23 including the interior of the opening OP2, whereby a capacitor or capacitance can be formed between the storage nodes A and B in FIG. 1. Further, the formation of the lower electrodes 22 in the fourth embodiment is also similar to the above.

While the invention made by the present inventors has been described specifically by the illustrated embodiments, the present invention is not limited to the embodiments. It is needless to say that many changes can be made within the scope not departing from the substance thereof.

Advantageous effects obtained by typical ones of the inventions disclosed in the present application will be described in brief as follows:

(1) Since a capacitive insulating film (silicon nitride film 23) and an upper electrode 24 are formed on cross-connecting wirings (MD1 and MD2) of a SRAM memory cell having a pair of n-channel type MISFETs (Qd1 and Qd2) whose gate electrodes and drains are respectively cross-connected, a capacitance can be formed of the wirings, capacitive insulating film and upper electrode. As a result, a soft error produced due to an α ray can be reduced.

Since the surface of each wiring takes a shape that protrudes from the surface of an interlayer insulating film (silicon nitride film 17, PSG film 20 and silicon oxide film 21), a capacitor or capacitance can be formed even at sidewalls of such a protruding portion, thus making it possible to achieve an increase in capacity.

(2) Since lower electrodes 22, a capacitive insulating film (silicon nitride film 23) and an upper electrode 24 are formed on cross-connecting wirings (MD1 and MD2) of a SRAM memory cell having a pair of n-channel type MISFETs whose gate electrodes and drains are respectively cross-connected, a capacitance formed of the lower electrodes 22, capacitive insulating film and upper electrode can be formed on the wirings. As a result, a soft error produced due to an a ray can be reduced. If areas for forming the lower electrodes are respectively set larger than those for forming the wirings, then an increase in capacitance can be achieved.

(3) Since the surfaces of cross-connecting wirings (MD1 and MD2) of a SRAM memory cell having a pair of n-channel type MISFETs whose gate electrodes and drains are respectively cross-connected, respectively take shapes that protrude from the surface of an interlayer insulating film, and a capacitance formed of the lower electrodes, capacitive insulating film and upper electrode is formed, a soft error produced due to an α ray can be reduced, and an increase in capacity can be achieved.

(4) Since concave portions a are respectively formed in the surfaces of cross-connecting wirings (MD1 and MD2) of a SRAM memory cell having a pair of n-channel type MISFETs whose gate electrodes and drains are respectively cross-connected, a capacitance can be formed even on each concave portion and an increase in capacity can be achieved.

(5) A high-performance SRAM memory cell having reduced a soft error produced due to an α ray can be manufactured.

The mentioned above, the present invention relates particularly to a technology effective for application not only to a cache memory used for a personal computer and a work station but also to a semiconductor integrated circuit device assembled on a mobile communication device such as a mobile telephone, etc, a memory card, and an IC card.

What we claim is:

1. A semiconductor integrated circuit device comprising:
a memory cell of a static random access memory including
a first transfer MISFET and a second transfer MISFET,
a first drive MISFET and a second drive MISFET and a first load MISFET and a second load MISFET,
the first and second drive MISFETs each having a source region and a drain region formed in a substrate,
the first and second load MISFETs each having a source region and a drain region formed in a substrate,
gate electrodes of the first and second drive MISFETs and the first and second load MISFETs formed over a main surface of the substrate;
a first insulating film formed over the first and second transfer MISFETs, the first and second drive MISFETs and the first and second load MISFETs,
wherein the first insulating film has a first opening and a second opening;
a first capacitor element formed over the side wall and bottom of the first opening such that the first capacitor element has a lower electrode including a first conductive film formed along the side wall and bottom of the first opening, a capacitor insulator film including a second insulating film formed over the first conductive film, and an upper electrode including a second conductive film formed over the second insulating film; and a second capacitor element formed over the side wall and bottom of the second opening such that the second capacitor element has a lower electrode including a third conductive film formed along the side wall and bottom of the second opening, a capacitor insulator film including a third insulating film formed over the third conductive film, and an upper electrode including a fourth conductive film formed over the third insulating film, wherein the first opening is formed to extend over the drain region of the first drive MISFET and the drain region of the first load MISFET such that the first conductive film is electrically connected to the drain of the first drive MISFET, the drain of the first load MISFET, the gate electrode of the second drive MISFET and the gate electrode of the second load MISFET, and wherein the second opening is formed to extend over the drain region of the second drive MISFET and the drain region of the second load MISFET such that the third conductive film is electrically connected to the drain of the second drive MISFET, the drain of the second load MISFET, the gate electrode of the first drive MISFET and the gate electrode of the first load MISFET.

2. A semiconductor integrated circuit device according to claim 1, wherein the second conductive film is integrally formed with the fourth conductive film.

3. A semiconductor integrated circuit device according to claim 1, wherein a fixed potential is applied to the second conductive film and the fourth conductive film.

4. A semiconductor integrated circuit device comprising:
a plurality of memory cells each including a first transfer MISFET and a second transfer MISFET, a first drive MISFET and a second drive MISFET, and a first load MISFET and a second load MISFET,
the first and second drive MISFETs each having a source region and a drain region formed in a substrate,
the first and second load MISFETs each having a source region and a drain region formed in a substrate,
gate electrodes of the first and second drive MISFETs and the first and second load MISFETs formed over a main surface of the substrate;
a first insulating film formed over the first and second transfer MISFETs, the first and second drive MISFETs and the first and second transfer load MISFETs,
wherein the first insulating film has a first opening and a second opening;
a first capacitor element formed over the side wall and bottom of the first opening such that the first capacitor element has a lower electrode including a first conductive film formed along the side wall and bottom of the first opening, a capacitor insulator film including a second insulating film formed over the first conductive film, and an upper electrode including a second conductive film formed over the second insulating film; and
a second capacitor element formed over the side wall and bottom of the second opening such that the second capacitor element has a lower electrode including a third conductive film formed along the side wall and bottom of the second opening, a capacitor insulator film including a third insulating film formed over the third conductive film, and an upper electrode including a fourth conductive film formed over the third insulating film,
wherein the first opening is formed to extend over the drain region of the first drive MISFET and the drain region of the first load MISFET such that the first conductive film is electrically connected to the drain of the first drive MISFET, the drain of the first load MISFET, the gate electrode of the second drive MISFET and the gate electrode of the second load MISFET, and
wherein the second opening is formed to extend over the drain region of the second drive MISFET and the drain region of the second load MISFET such that the third conductive film is electrically connected to the drain of the second drive MISFET, the drain of the second load MISFET, the gate electrode of the first drive MISFET and the gate electrode of the first load MISFET.

5. A semiconductor integrated circuit device according to claim 4, wherein the second conductive film is integrally formed with the fourth conductive film.

6. A semiconductor integrated circuit device according to claim 4, wherein a fixed potential is applied to the second conductive film and the fourth conductive film.

* * * * *